(12) United States Patent
Park et al.

(10) Patent No.: US 9,830,083 B2
(45) Date of Patent: Nov. 28, 2017

(54) MEMORY CHIP, MEMORY SYSTEM, AND METHOD OF ACCESSING THE MEMORY CHIP

(71) Applicant: Samsung Electronics Co., Ltd., Suwon-si (KR)

(72) Inventors: Chul-sung Park, Seoul (KR); Joo-sun Choi, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 86 days.

(21) Appl. No.: 14/858,180

(22) Filed: Sep. 18, 2015

(65) Prior Publication Data

US 2016/0011781 A1 Jan. 14, 2016

Related U.S. Application Data

(63) Continuation of application No. 13/427,625, filed on Mar. 22, 2012.

(Continued)

(30) Foreign Application Priority Data

Sep. 9, 2011 (KR) ........................ 10-2011-0092219

(51) Int. Cl.
*G06F 3/06* (2006.01)
*G11C 11/56* (2006.01)
(Continued)

(52) U.S. Cl.
CPC ............ *G06F 3/061* (2013.01); *G06F 3/0659* (2013.01); *G06F 3/0688* (2013.01); *G11C 7/10* (2013.01);
(Continued)

(58) Field of Classification Search
CPC ...... G06F 3/0688; G06F 3/061; G06F 3/0659; G11C 8/10; G11C 7/10; G11C 11/5678;
(Continued)

(56) References Cited

U.S. PATENT DOCUMENTS 4,799,187 A * 1/1989 Einarson ............. G06F 12/0692 711/220
5,809,262 A * 9/1998 Potter ................. G06F 13/4027 710/305

(Continued)

FOREIGN PATENT DOCUMENTS

JP 09-265775 10/1997
KR 10-2002-0016361 A 3/2002
(Continued)

*Primary Examiner* — Jasmine Song
(74) *Attorney, Agent, or Firm* — Muir Patent Law, PLLC

(57) ABSTRACT

A memory chip, a memory system, and a method of accessing the memory chip. The memory chip includes a substrate, a first storage unit, and a second storage unit. The first storage unit includes a plurality of first memory cells may have a first storage capacity of $2^n$. The plurality of first memory cells may be configured to activate in response to a first selection signal. The second storage unit includes a plurality of second memory cells and may have a second storage capacity of $2^{n+1}$. The plurality of second memory cells may be configured to activate in response to a second selection signal.

20 Claims, 28 Drawing Sheets

Related U.S. Application Data

(60) Provisional application No. 61/490,136, filed on May 26, 2011.

(51) Int. Cl.
  *G11C 7/10* (2006.01)
  *G11C 8/10* (2006.01)

(52) U.S. Cl.
  CPC ............... *G11C 8/10* (2013.01); *G11C 11/56* (2013.01); *G11C 11/565* (2013.01); *G11C 11/5607* (2013.01); *G11C 11/5621* (2013.01); *G11C 11/5678* (2013.01); *G11C 11/5685* (2013.01); *G11C 2211/5641* (2013.01); *G11C 2213/71* (2013.01)

(58) Field of Classification Search
  CPC . G11C 11/5607; G11C 11/5621; G11C 11/56; G11C 11/565; G11C 11/5685
  USPC ............. 711/103, 170, E12.008; 365/230.01, 365/230.03
  See application file for complete search history.

(56) References Cited

U.S. PATENT DOCUMENTS

| | | | | |
|---|---|---|---|---|
| 5,953,280 | A * | 9/1999 | Matsui | G11C 7/1072 365/185.11 |
| 7,865,809 | B1 * | 1/2011 | Lee | G06F 11/1068 714/781 |
| 8,103,818 | B2 * | 1/2012 | Yuasa | G06F 12/0623 711/5 |
| 2003/0076702 | A1 * | 4/2003 | Kyung | G11C 7/10 365/51 |
| 2009/0049234 | A1 * | 2/2009 | Oh | G06F 12/0246 711/103 |
| 2009/0274017 | A1 | 11/2009 | Nemazie et al. | |
| 2012/0036341 | A1 * | 2/2012 | Morfey | G06F 12/1491 712/229 |

FOREIGN PATENT DOCUMENTS

| | | |
|---|---|---|
| KR | 10-2003-0034496 A | 5/2003 |
| KR | 10-2003000810 A | 10/2003 |

* cited by examiner

FIG. 1
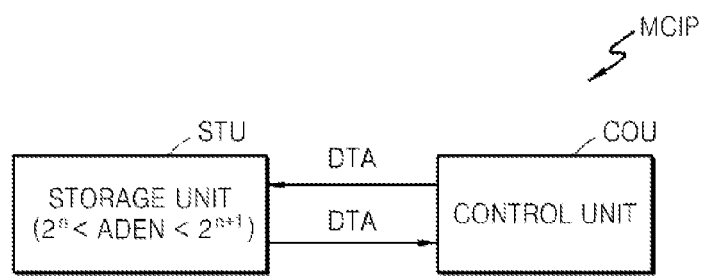
FIG. 2
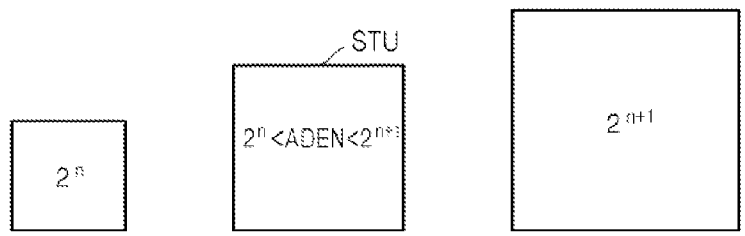
FIG. 3
| Density | 64Mb | 128Mb | 256Mb | 512Mb | 1Gb | 2Gb |
|---|---|---|---|---|---|---|
| Bank Address (BA) | [1:0] | [1:0] | [1:0] | [1:0] | [1:0] | [1:0] |
| Row Address (RA) | [10:0] | [11:0] | [11:0] | [12:0] | [12:0] | [13:0] |
| Column Address (CA) | [7:0] | [7:0] | [8:0] | [8:0] | [9:0] | [9:0] |

$2^n$

| BA | [a:0] |
|---|---|
| RA | [b:0] |
| CA | [c:0] |

$(a+1)+(b+1)+(c+1)=n$

ADEN (Addr[n:0])

| BA | [a+1:0] |
|---|---|
| RA | [b:0] |
| CA | [c:0] |

$(a+2)+(b+1)+(c+1)=n+1$

| ADEN(Addr[n:0]) | |
|---|---|
| BA | [a:0] |
| RA | [b+1:0] |
| CA | [c:0] |

$(a+1)+(b+2)+(c+1)=n+1$

MEMORY CHIP, MEMORY SYSTEM, AND METHOD OF ACCESSING THE MEMORY CHIP

CROSS-REFERENCE TO RELATED APPLICATIONS

This application is a continuation application of U.S. patent application Ser. No.: 13/427,625, filed on Mar. 22, 2012, which claims the benefit of U.S. Provisional Patent Application No. 61/490,136, filed on May 26, 2011, in the U.S. Patent and Trademark Office, and the benefit of Korean Patent Application No. 10-2011-0092219, filed on Sep. 9, 2010, in the Korean Intellectual Property Office, the disclosures of which are incorporated herein in their entirety by reference.

BACKGROUND

Example embodiments relate to a memory chip, a memory system, and a method of accessing the memory chip, and more particularly, to a memory chip having a storage capacity optimized for use, a memory system, and a method of accessing the memory chip.

An address for accessing a storage unit of a memory chip is set as the number of bits corresponding to a storage capacity of the storage unit of the memory chip. Each bit of the address may have a value 0 or 1. Accordingly, the storage capacity of the memory chip may be set as a $2^n$ standard capacity.

SUMMARY

The present disclosure provides a memory chip having a storage capacity optimized for use, a memory system, and a method of accessing the memory chip.

According to one embodiment, a memory chip includes a substrate, a first storage unit, and a second storage unit. The first storage unit includes a plurality of first memory cells having a first storage capacity of $2^n$, wherein the plurality of first memory cells are configured to activate based on a first selection signal. The second storage unit includes a plurality of second memory cells and has a second storage capacity of $2^{n-1}$, wherein the plurality of second memory cells are configured to activate based on a second selection signal. The first storage unit and the second storage unit are disposed at the same vertical level on the substrate, and wherein n is a positive integer.

The memory chip may further include an interface unit configured for transmitting or receiving a first data, a first address, and a first control signal regarding the first storage unit to or from an external device, in response to the first selection signal, or transmitting or receiving a second data, a second address, and a second control signal regarding the second storage unit to or from the external device, in response to the second selection signal.

The interface unit may include a first input/output unit configured for transmitting or receiving the first data, the first address, and the first control signal regarding the first storage unit; and a second input/output unit configured for transmitting or receiving the second data, the second address, and the second control signal regarding the second storage unit, and formed independently from the first input/output unit.

The interface unit may include a common input/output unit configured for transmitting or receiving at least one of the group consisting of the first data, the first address, and the first control signal regarding the first storage unit, and transmitting or receiving at least one of the group consisting of the second data, the second address, and the second control signal regarding the second storage unit.

A type of memory cells for forming the first storage unit may be the same as the type of memory cells for forming the second storage unit.

Alternatively, a type of memory cells for forming the first storage unit may be different from the type of memory cells for forming the second storage unit.

A use of data stored in the first storage unit may be the same as the use of data stored in the second storage unit.

Alternatively, a use of data stored in the first storage unit may be different from the use of data stored in the second storage unit.

According to another embodiment, a memory chip includes a substrate, a storage unit, and a control unit. The storage unit includes a storage region having a storage capacity, wherein the storage capacity is greater than a storage capacity of $2^n$ and less than a storage capacity of $2^{n+}$, wherein n is a positive integer. The control unit is configured for controlling write and read operations of data into and from the storage unit. The storage unit and the control unit are disposed on the substrate. Data of the storage unit are accessible in response to a single address that is 1-bit greater than a single address with respect to the storage capacity of $2^n$.

If the single address not mapped to the storage unit is received, the control unit may process an access result regarding the memory address as failure.

The control unit may operate as if the storage unit corresponding to the memory address is non-activated, or may operate as if a command regarding the memory address is not received, so as to processes the access result as failure.

The single address for accessing the storage unit may include a bank address for accessing one of banks, and the bank address regarding the storage unit may be 1-bit greater than a bank address with respect to the storage capacity of $2^n$.

The single address for accessing the storage unit may include a row address for accessing one of rows, and the row address regarding the storage unit may be 1-bit greater than a row address with respect to the storage capacity of $2^n$.

The single address for accessing the storage unit may include a column address for accessing one of columns, and the column address regarding the storage unit may be 1-bit greater than a column address with respect to the storage capacity of $2^n$.

The memory chip may be at least one of the group consisting of dynamic random access memory (DRAM), static random access memory (SRAM), flash memory, resistive random access memory (RRAM), magnetoresistive random access memory (MRAM), and phase-change random access memory (PRAM).

According to further another embodiment, a memory device includes a substrate, a decoder, and an addressable memory. The decoder is configured to receive a single address including n+1 bits, wherein n is a positive integer. The addressable memory includes m memory cell units, each of the m memory cell units being made accessible by the decoder in response to receiving the single address, each memory unit comprises one or more memory cells that are not separately addressable within the memory device. The m is a positive integer greater than $2^n$ and less than $2^{n+1}$.

BRIEF DESCRIPTION OF THE DRAWINGS

Exemplary embodiments will be more clearly understood from the following detailed description taken in conjunction with the accompanying drawings in which:

FIG. 1 is a block diagram of a memory chip according to example embodiments;

FIG. 2 is a diagram showing a storage capacity of a storage unit illustrated in FIG. 1;

FIG. 3 is a table showing correlations between a standard capacity and the number of bits of an address in a memory chip;

DETAILED DESCRIPTION OF THE EMBODIMENTS

Figure 4A:
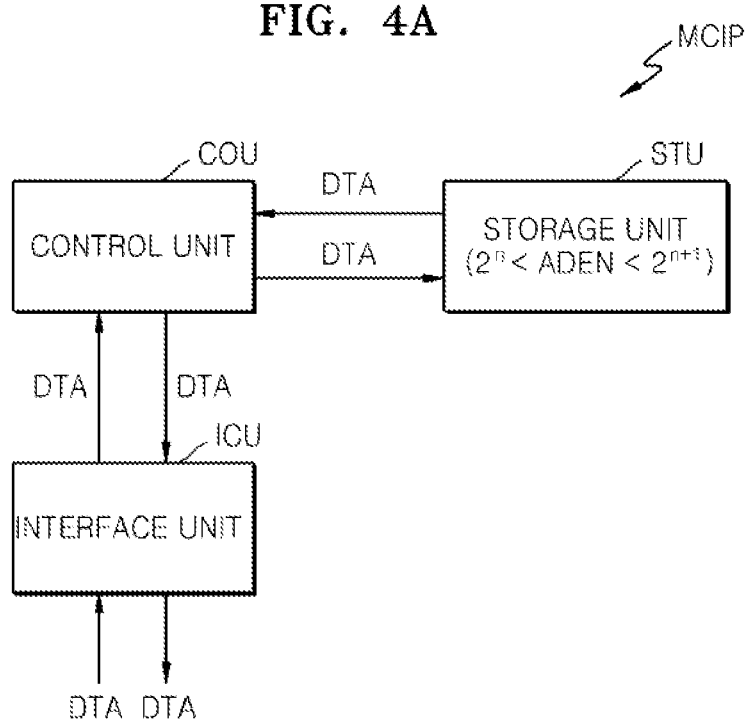
FIG. 4A is a block diagram of a memory chip according to one embodiment.

Various example embodiments will be described in detail hereinafter with reference to the attached drawings.

The present disclosure may, however, be embodied in many different forms and should not be construed as being limited to the embodiments set forth herein. In the drawings, the sizes and relative sizes of layers and regions may be exaggerated for clarity.

The terminology used herein is for the purpose of describing particular embodiments and is not intended to limit the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, embodiments of the disclosure will be described with reference to accompanying drawings schematically illustrating the embodiments. In the drawings, for example, illustrated shapes may be deformed according to fabrication technology and/or tolerances. Therefore, the embodiments of the present disclosure are not limited to certain shapes illustrated in the present specification, and may include modifications or deviations of shapes caused in fabrication processes.

As used herein, expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of a memory chip MCIP according to example embodiments.

Referring to FIG. 1, the memory chip MCIP includes a storage unit STU and a control unit COU. The storage unit STU may store data of a storage capacity greater than a first standard storage capacity ($2^n$, n is a positive integer) and less than a second standard storage capacity ($2^{n+1}$), as illustrated in FIG. 2. For example, the first standard storage capacity may be 64 Mb, 128 Mb, 256 Mb, 512 Mb, 1 Gb, or 2 Gb and the second standard storage capacity is twice greater than the first standard storage capacity. For example, if the first standard storage capacity is 2 Gb the second standard storage capacity is 4 Gb. Hereinafter, the storage capacity greater than the first standard storage capacity and less than the second standard storage capacity is referred to as an arbitrary storage capacity. The arbitrary storage capacity is represented as ADEN ($2^n$<ADEN<$2^{n+1}$).

The memory chip MCIP may be volatile memory such as dynamic random access memory (DRAM) or Static Random Access Memory (SRAM), or non-volatile memory such as flash memory, resistive random access memory (RRAM), magnetoresistive random access memory (MRAM), or phase-change random access memory (PRAM). In addition, the memory chip MCIP may be a memory device and included in various packages such as, BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flat-Pack), SOIC (Small Outline Integrated Circuit), SSOP (Shrink Small Outline Package), TSOP (Thin Small Outline Package), TQFP (Thin Quad Flat-Pack), SIP (System In Package), and WFP (Wafer-level Fabricated Package).

FIG. 3 is a table showing the number of bits of an address according to an increase in the standard storage capacity of a standard mobile DRAM (DDR×32). Referring to FIG. 3, whenever the standard storage capacity of the standard mobile DRAM (DDR×32) is doubled, the number of bits of an address is increased by one. For example, if an address regarding a 128 Mb standard mobile DRAM (DDR×32) is set as 22 bits (BA[1:0], RA[11:0], CA[7:0]), an address regarding a 256 Mb standard mobile DRAM (DDR×32) is set as 23 bits (BA[1:0], RA[11:0], CA[8:0]). The address including 22 bits or 23 bits may be referred as a single address for selecting one or more memory cells in the storage unit STU of the FIG. 1.

However, in memory chips that require higher storage capacities and integrations, due to limitations in, for example, processes, much time is required to satisfy demands to increase storage capacities of the memory chips to a next-level standard storage capacity that is greater than the largest currently commercialized or developed standard storage capacity. Nevertheless, the amount of information used by individuals today is increasing and thus a high storage capacity is increasingly demanded from a storage unit of a memory chip. Also, since electronic devices are becoming more portable, low power consumption has become an important factor.

Even before a memory chip having a standard storage capacity (e.g., $2^{n+1}$) twice greater than the largest currently commercialized or developed standard storage capacity (e.g., $2^n$) is developed, a memory chip according to an embodiment of the disclosure may have an arbitrary storage capacity that satisfies demands for a high storage capacity and may be easily access-controlled. Also, the memory chip according to an embodiment of the disclosure may have a storage capacity optimized to demands of users in consideration of power consumption or the like, and may be easily access-controlled to store and read data. Detailed descriptions thereof will now be provided.

Referring back to FIG. 1, the control unit COU controls a write operation of data DTA into the storage unit STU, and a read operation of the data DTA from the storage unit STU. For example, the control unit COU may decode an address for writing or reading the data DTA, or may apply a voltage for writing or reading the data DTA to a row and a column corresponding to the address.

The data DTA to be stored in the storage unit STU and the data DTA read from the storage unit STU may be received from and transmitted to an external device (not shown) via an interface unit ICU illustrated in FIG. 4A. Although not shown in FIG. 4A, an address and a control signal for storing and reading the data DTA into and from the storage unit STU may also be received from the external device via the interface unit ICU. In this case, the external device may be a controller to be described below. Detailed descriptions thereof will be provided below.

Figure 4B:
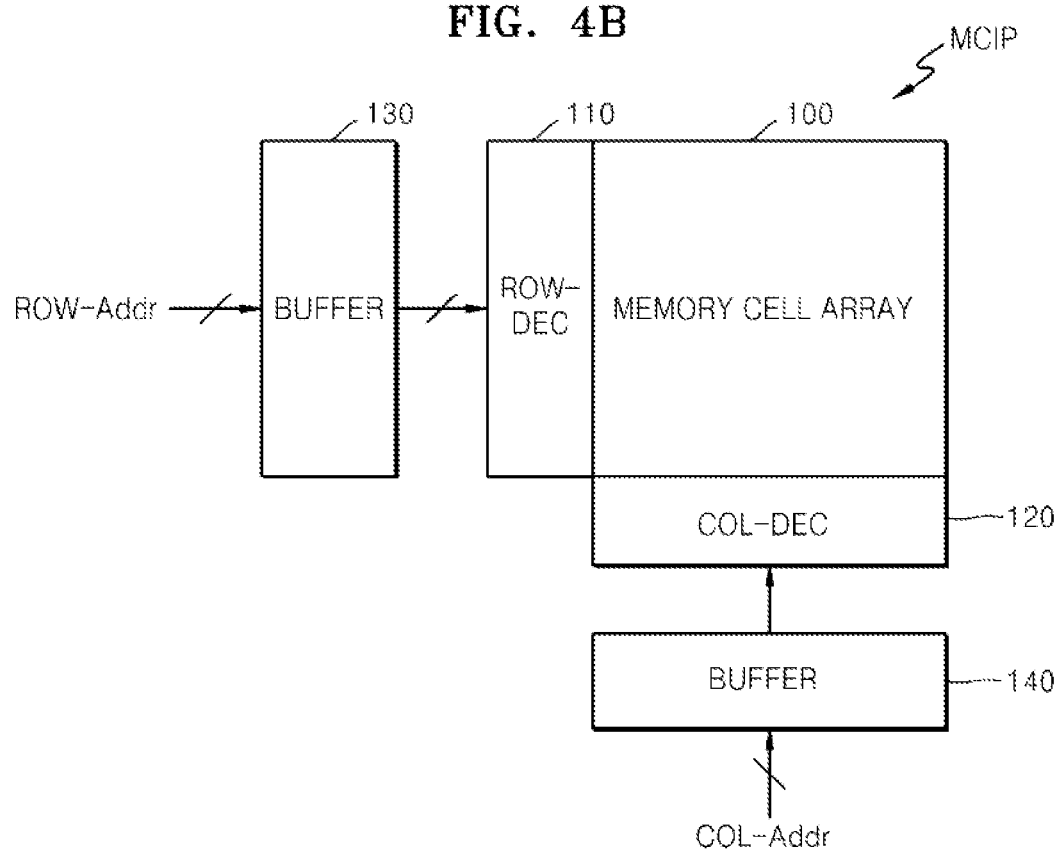
FIG. 4B is a block diagram of a memory chip according to another embodiment.

FIG. 4B is a block diagram of a memory chip according to another embodiment. Referring to FIG. 4B, the memory chip comprises a memory cell array 100 including a plurality of memory cell unit for storing or reading data. Each memory cell unit may comprise one or more memory cells.

A row address buffer 130 may receive row addresses and column address buffer 140 may receive column addresses. A row decoder 110 may decode buffered row addresses and generate word lines (not shown) and a column decoder 120 may decode buffered column addresses and generate column selection lines (not shown). Additionally, the row decoder 110 or column decoder 120 may receive bank addresses (not shown). For example, at least one single address including a row address, a column address, and a bank address may select one or more memory cells for storing or reading data.

Each memory cell unit may comprise the minimum addressable size of memory. For example, a memory cell unit may not include parts of memory that are separately addressable. Thus, each complete address (including the least significant address bit to the most significant address bit) uniquely identifies a different memory cell unit. The one or more memory cells of each memory cell unit may be selected and/or accessed simultaneously by a single address (e.g., for storing or reading data).

In one embodiment, the memory cell array 100 may include m memory cell units having one or more memory cells. The integer m may be greater than $2^n$ and less than $2^{n+1}$. For example, if a storage capacity of the memory chip is 3 Gb ($3 \times 2^{30}$ bits) and the memory cell unit is 32b in size, the number of memory cell units, m is 96M ($96 \times 2^{20}$). This number of memory cell units is between $2^n$ and $2^{n+1}$ (where n in a positive integer). In this example, the integer n=26, so the number of memory cell units m (96M) is between 64M ($2^n$) and 128M ($2^{n+1}$). The number of address bits needed to access all 96M memory units is 27 bits (n+1 bits). As will be understood, n+1 address bits received by the memory chip are sufficient to access 128M ($2^{n+1}$) memory units, however, the memory chip in this example only includes 96M memory units. Thus, a substantial portion of the address space defined by the received n+1 address bits is not associated with memory locations within the memory chip. For example, over 10% but less than 40% of the address space defined by the n+1 address bits received by the memory chip is not associated with memory locations of the memory chip. For example, over 10% but less than 40% of the individual addresses which may be defined by the n+1 address bits do not identify any memory location within the memory chip. For example, about 25% (e.g., 20% to 30%) of the address space defined by the received n+1 address bits received by the memory chip is not associated with memory locations of the memory chip. For example, about 25% of the individual addresses which may be defined by the n+1 address bits do not identify any memory location within the memory chip. Also, in this example, only about 75% (e.g., 70% to 80%) of the address space defined by the n+1 address bits received by the memory chip is associated with memory locations of the memory chip. Only about 75% (e.g., 70% to 80%) of the individual addresses which may be defined by the received n+1 address bits uniquely identify a respective memory location within the memory chip. As an additional example, only 60% to 90% of the address space defined by the n+1 address bits received by the memory chip is associated with memory locations of the memory chip. Only 60% to 90% of the individual addresses which may be defined by the received n+1 address bits uniquely identify a respective memory location within the memory chip.

Figure 5:
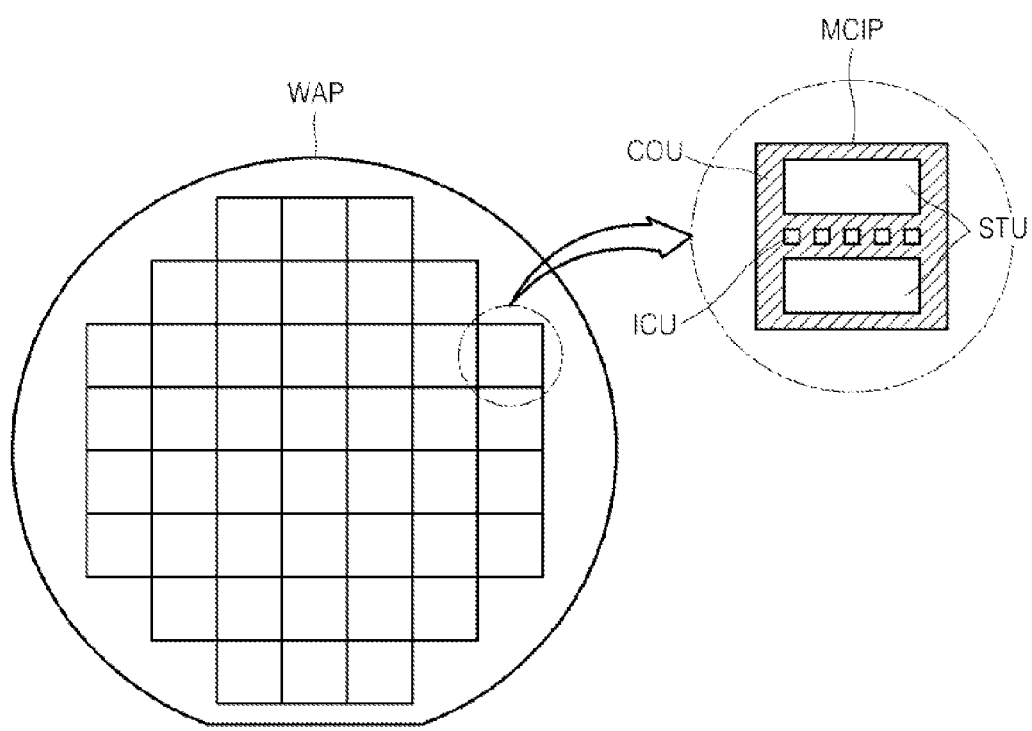
FIG. 5 is a schematic diagram of a wafer on which memory chips are formed, according to an embodiment.

The memory chip MCIP may be formed on a wafer WAP, as illustrated in FIG. 5. The control unit COU may be formed outside the storage unit STU, as illustrated as a shaded part in FIG. 5. The storage unit STU may be divided into predetermined storage regions (e.g., banks), as illustrated in FIG. 5. For example, the control unit COU may also be formed between the storage regions. The interface unit ICU may also be formed outside the storage unit STU or between the storage regions of the storage unit STU. FIG. 5 particularly shows an example when the interface unit ICU is formed between the storage regions. In one embodiment, the control unit COU, the storage unit STU, and the interface unit ICU may be formed at the same vertical level (e.g., within a single chip) on the same substrate of the wafer WAP.

Figure 6:
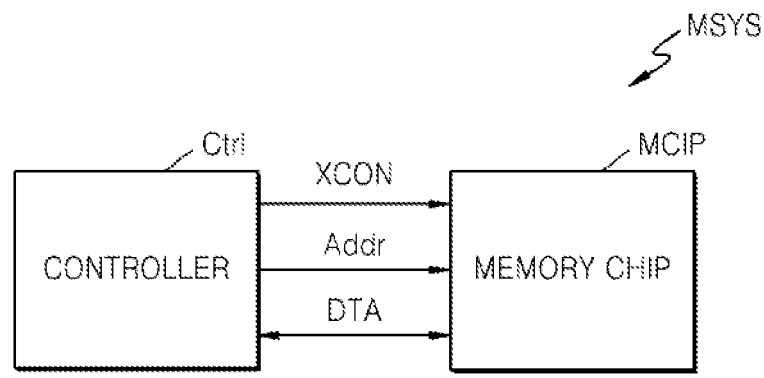
FIG. 6 is a block diagram of a memory system according to an embodiment.

The memory chip MCIP that has an arbitrary storage capacity and is implemented as one chip, as illustrated in FIG. 5 may be used to implement a memory system MSYS together with a controller Ctr1, as illustrated in FIG. 6. Referring to FIGS. 1 and 6, the controller Ctr1 of the memory system MSYS transmits data DTA, an address Addr, and a control signal XCON to the memory chip MCIP in order to write the data DTA into the storage unit STU of the memory chip MCIP. Also, the controller Ctr1 transmits the address Addr and the control signal XCON to the memory chip MCIP in order to read the data DTA from the storage unit STU of the memory chip MCIP, and receives the data DTA from the memory chip MCIP. In addition, aspects of the disclosed embodiments may be used in systems such as cell phones, PDAs, tablet computers, laptops, desktop computers, microprocessor systems, digital signal processors, communication system processors, or other systems.

In one embodiment, the number of bits of the address Addr transmitted from the controller Ctr1 to the memory chip MCIP may correspond to a storage capacity of the memory chip MCIP. For example, if the storage unit STU of the memory chip MCIP has a storage capacity of $2^n$ and ×1 I/O organization (i.e., one memory cell unit is 1 bit), the number of bits of the address Addr may be n. Additionally, for example, if the storage unit STU of the memory chip MCIP has a storage capacity of $2^n$ and ×32 I/O organization (i.e., one memory cell unit is 32 bits), the number of bits of the address Addr may be n−5. Also, if the storage unit STU of the memory chip MCIP has a storage capacity of $2^{n+1}$ and ×1 I/O organization, the number of bits of the address Addr may be n+1. Additionally, for example, if the storage unit STU of the memory chip MCIP has a storage capacity of $2^{n+1}$ and ×32 I/O organization the number of bits of the address Addr may be n−4.

As described above, the storage unit STU of the memory chip MCIP has an arbitrary storage capacity. Accordingly, an access method different from the access method for a standard storage capacity is used.

Figure 7:
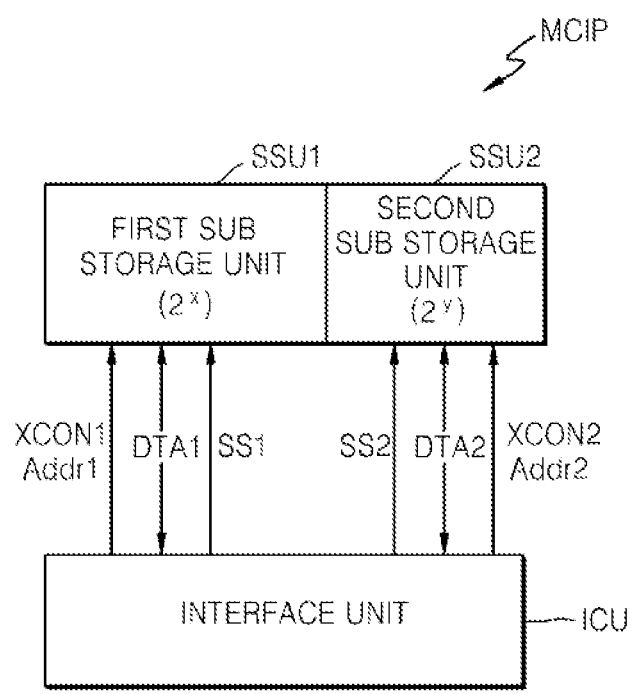
FIG. 7 is a block diagram of a memory chip according to one embodiment.
Figure 8:
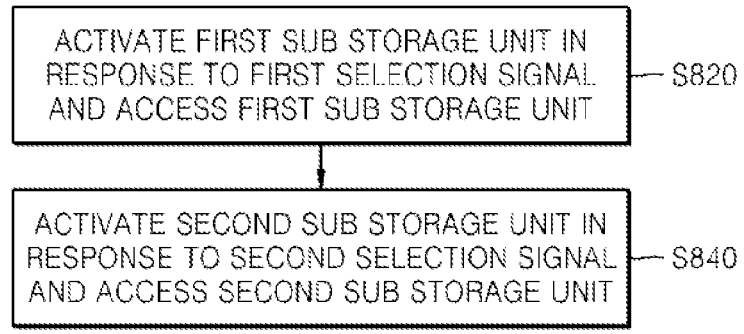
FIG. 8 is a flowchart of a method of accessing first and second sub storage units illustrated in FIG. 7.

FIG. 7 is a block diagram of a memory chip MCIP according to one embodiment. FIG. 8 is a flowchart of a method of accessing first and second sub storage units SSU1 and SSU2 illustrated in FIG. 7.

Referring to FIGS. 1, 7, and 8, the access method includes activating the first storage unit SSU1 in response to a first selection signal SS1 and accessing the first storage unit SSU1 (operation S820); and activating the second sub storage unit SSU2 in response to a second selection signal SS2 and accessing the second sub storage unit SSU2 (operation S840). The storage unit STU illustrated in FIG. 1 may also include the first and second sub storage units SSU1 and SSU2 illustrated in FIG. 7. In this case, the first sub storage unit SSU1 has a storage capacity of a third standard storage capacity ($2^x$), and the second sub storage unit SSU2 has a storage capacity of a fourth standard storage capacity ($2^y$). A sum of the third and fourth standard capacities equals to an arbitrary storage capacity. For example, if the arbitrary storage capacity is 3 GB, the third standard storage capacity ($2^x$), may be 2 GB and the fourth standard storage capacity ($2^y$) may be 1 GB. In one embodiment, the arbitrary storage capacity may be greater than $1.25 \times 2^x$ and less than $1.75 \times 2^x$.

The first sub storage unit SSU1 is activated in response to the first selection signal SS1. The activated first sub storage unit SSU1 is accessed based on an address Addr1 regarding the first sub storage unit SSU1. In this case, the number of bits of the address Addr1 regarding the first sub storage unit SSU1 is set to correspond to the third standard storage capacity ($2^x$). Data DTA1 and a control signal XCON1 may be transmitted to the accessed first sub storage unit SSU1, or the data DTA1 may be output from the accessed first sub storage unit SSU1.

In this case, an operation of transmitting or outputting the data DTA1, the address Addr1, or the control signal XCON1 regarding the first sub storage unit SSU1 to or from the first sub storage unit SSU1 refers to an operation that the control unit COU illustrated in FIG. 1 applies a voltage corresponding to the data DTA1, the address Addr1, or the control signal XCON1 regarding the first sub storage unit SSU1, to an accessed storage region (memory cells). For example, if the address Addr1 indicates a first memory cell (not shown) of the first sub storage unit SSU1, the control signal XCON1 is a write command, and the data DTA1 indicates a value 1, the control unit COU illustrated in FIG. 1 applies a voltage corresponding to a write operation of the value 1, to a row and a column connected to the first memory cell. Hereinafter, an operation of transmitting or receiving an address, a control signal, or data to or from a sub storage unit also is performed as the above-described operation.

The first selection signal SS1 may be directly applied to the first sub storage unit SSU1 as illustrated in FIG. 7, so as to activate power supply to the first sub storage unit SSU1. However, the disclosure is not limited thereto. The first selection signal SS1 may also activate the first sub storage unit SSU1 by activating and transmitting the address Addr1, the control signal XCON1, or the data DTA1 to the first sub storage unit SSU1. The same principle applies to the following description.

Referring again to FIG. 7, the second sub storage unit SSU2 is activated in response to the second selection signal SS2. The second sub storage unit SSU2 is accessed based on an address Addr2 regarding the second sub storage unit SSU2. In this case, the number of bits of the address Addr2 regarding the second sub storage unit SSU2 is set to correspond to the fourth standard storage capacity ($2^y$). Data DTA2 and a control signal XCON2 may be transmitted to the accessed second sub storage unit SSU2, or the data DTA2 may be output from the accessed second sub storage unit SSU2.

The interface unit ICU may transmit or receive the data DTA1, the address Addr1, or the control signal XCON1 regarding the first sub storage unit SSU1, or may transmit or receive the data DTA2, the address Addr2, or the control signal XCON2 regarding the second sub storage unit SSU2, based on an activated signal from among the first and second selection signals SS1 and SS2.

As described above, a memory chip according to an embodiment of the inventive concept may include a storage unit having an arbitrary storage capacity and the storage unit may be divided into sub storage units having different standard capacities to individually activate and access the sub storage units. In this case, each sub storage unit is accessed based on an address having a number of bits corresponding to its standard storage capacity. Accordingly, although a standard storage capacity is implemented as an arbitrary storage capacity, since only an operation of simply selecting a sub storage unit to be accessed is added, the memory chip according to an embodiment of the inventive concept may be easily access-controlled.

Figure 9:
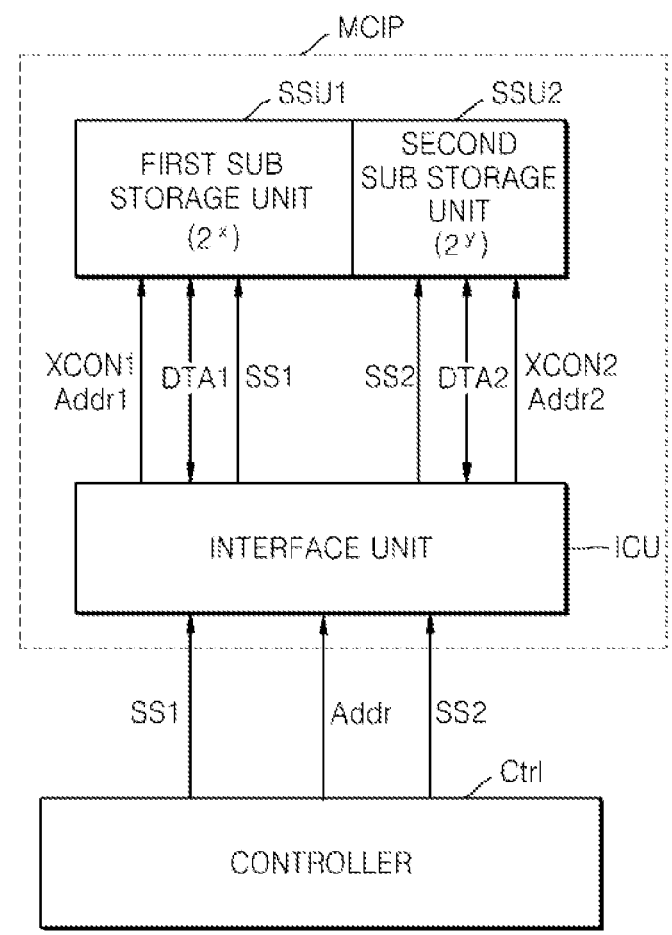
FIGS. 9 through 12 are diagrams showing example embodiments of first and second selection signals illustrated in FIG. 7.
Figure 10:
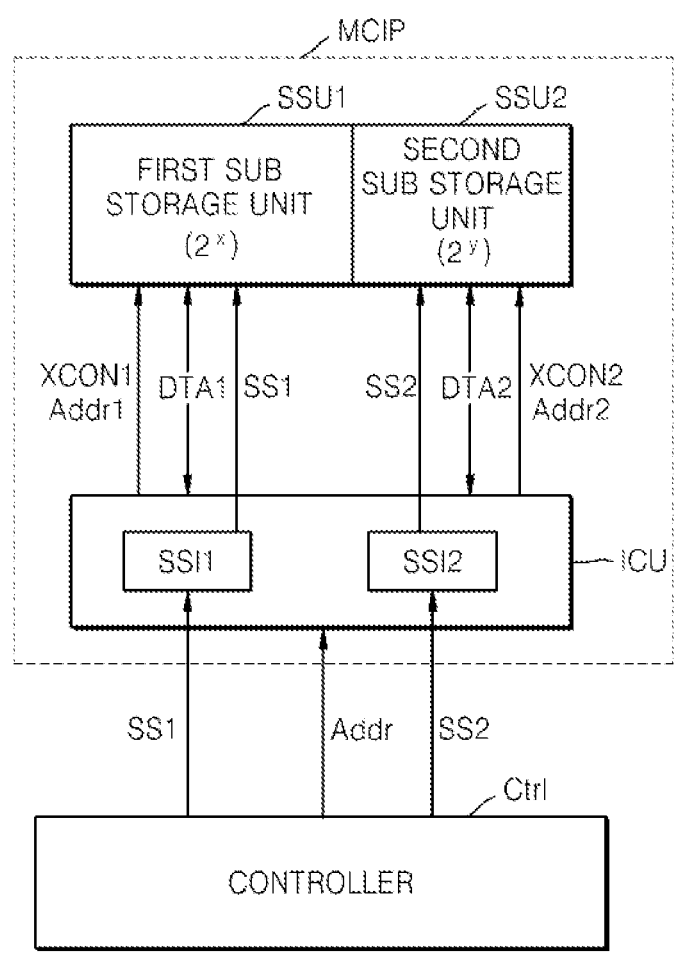

Referring again to FIG. 7, the first and second selection signals SS1 and SS2 may be received from the controller Ctr1, as illustrated in FIG. 9. When the address Addr is input, the controller Ctr1 may transmit one of the first and second selection signals SS1 and SS2 to the memory chip MCIP based on the status of bits of an address Addr. The interface unit ICU illustrated in FIG. 9 may include a first selection signal input unit SSI1 for receiving the first selection signal SS1, and a second selection signal input unit SSI2 for receiving the second selection signal SS2, as illustrated in FIG. 10. The first and second selection signal input units SSI1 and SSI2 may be independently included.

Figure 11:
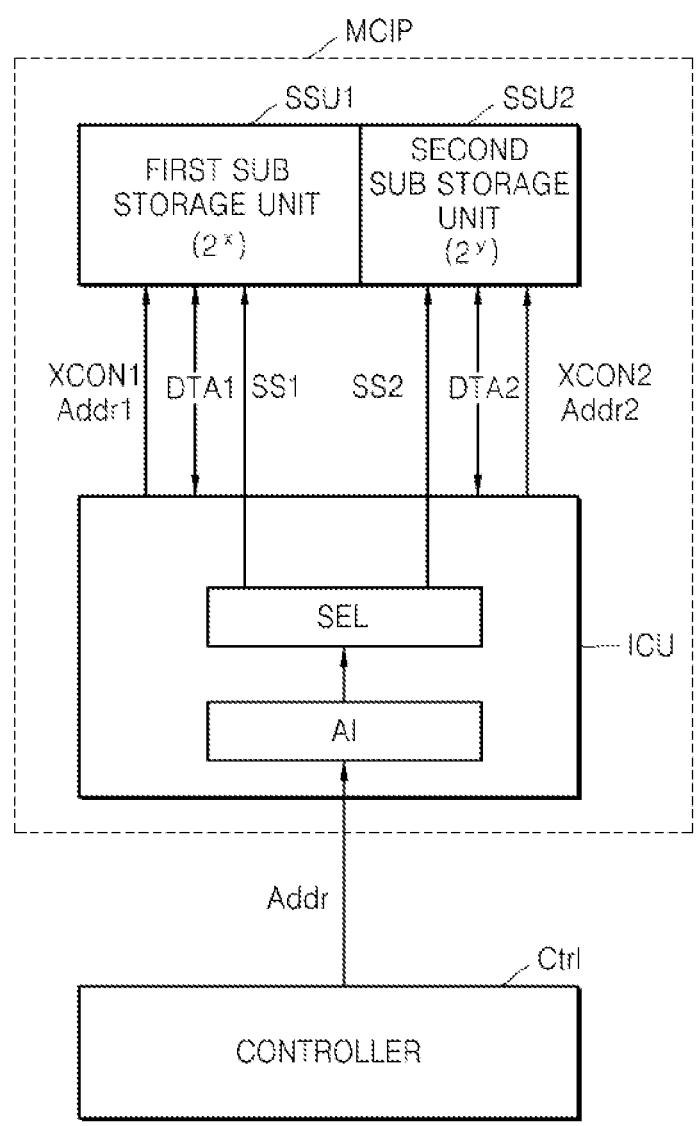

The first and second selection signals SS1 and SS2 may be transmitted from the controller Ctr1, as illustrated in FIG. 10, or may be generated in the memory chip MCIP as illustrated in FIG. 11. The interface unit ICU illustrated in FIG. 11 activates one of the first and second selection signals SS1 and SS2 based on the received address Addr.

In one embodiment, the interface unit ICU includes an address input unit AI and a selection unit SEL. The address input unit AI receives the address Addr from the controller Ctr1. The selection unit SEL outputs a selection signal regarding a sub storage unit indicated by the address Addr. For example, the controller Ctr1 may generate the address Addr by including an identifier representing whether a sub storage unit to be accessed is the first sub storage unit SSU1 or the second sub storage unit SSU2. In this case, the selection unit SEL may activate one of the first and second selection signals SS1 and SS2 based on the identifier included in the address Addr.

Figure 12:
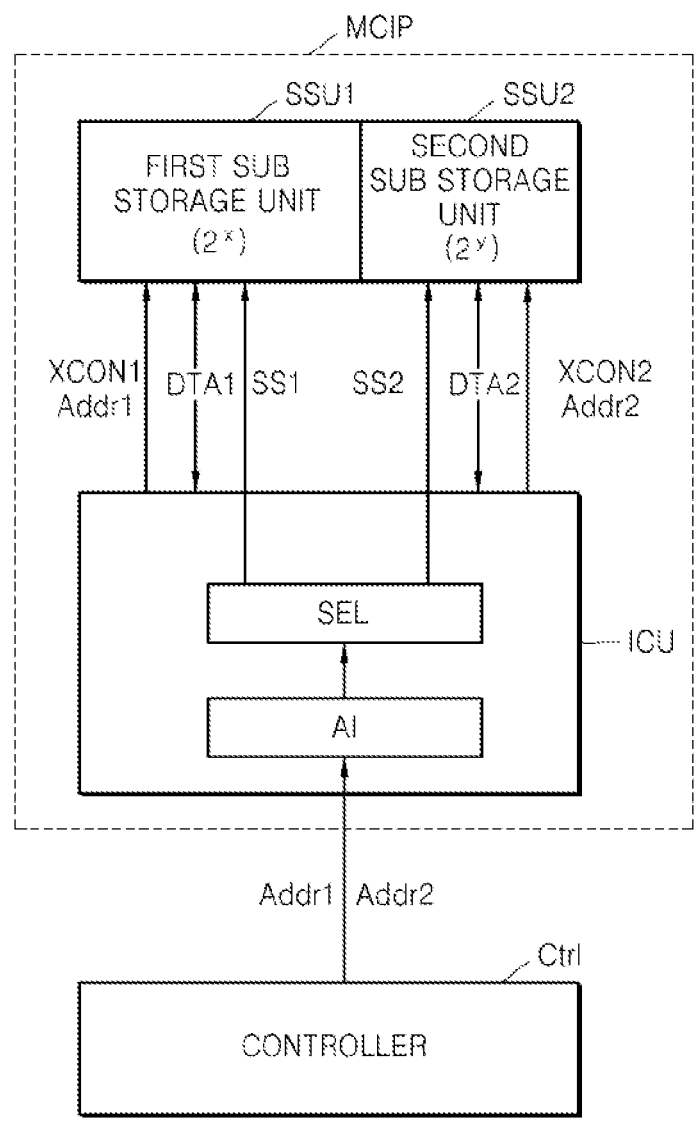

Alternatively, as illustrated in FIG. 12, the address input unit AI of the interface unit ICU receives the address Addr1 regarding the first sub storage unit SSU1 or the address Addr2 regarding the second sub storage unit SSU2. The selection unit SEL activates one of the first and second selection signals SS1 and SS2 based on the number of bits of an address transmitted from the address input unit AI. For example, the selection unit SEL may activate the first selection signal SS1 if an x-bit address is received, and may activate the second selection signal SS2 if a y-bit address.

Based on a selected signal from among the first and second selection signals SS1 and SS2, one of the first and second sub storage units SSU1 and SSU2 is activated. That is, based on a selected signal from among the first and second selection signals SS1 and SS2, data, an address, or a control signal regarding one of the first and second sub storage units SSU1 and SSU2 is transmitted to a corresponding sub storage unit, or data regarding one of the first and second sub storage units SSU1 and SSU2 is output from the sub storage unit.

In FIGS. 9 through 12, from among signals (selection signals, addresses, data, and control signals) transmitted or received between the controller Ctr1 and the memory chip MCIP, only signals required for explanation are illustrated for convenience sake. Although the first and second selection signals SS1 and SS2 may be generated by using various methods, hereinafter, for convenience of explanation, it is assumed that the first and second selection signals SS1 and SS2 are transmitted from an external device (e.g., the controller Ctr1).

Figure 13:
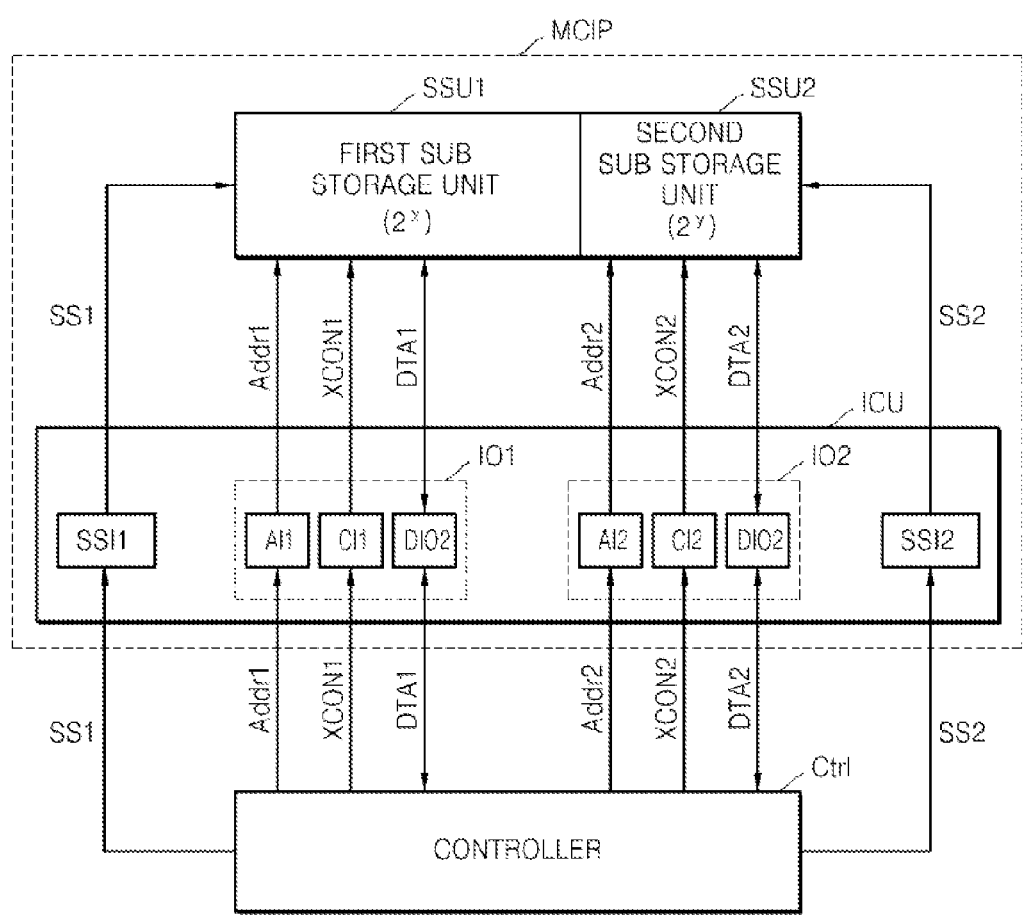
FIGS. 13 through 14 are diagrams showing example embodiments of an interface unit illustrated in FIG. 7.

The interface unit ICU also transmits or receives data, an address, or a control signal as described above. For this, as illustrated in FIG. 13, the interface unit ICU includes first and second input/output units IO1 and IO2. The first input/output unit IO1 transmits or receives the data DTA1, the address Addr1, or the control signal XCON1 regarding the first sub storage unit SSU1 to or from an external device (e.g., the controller Ctr1).

The first input/output unit IO1 may include a first address input unit AI1 for receiving the address Addr1 regarding the first sub storage unit SSU1, a first control signal input unit CI1 for receiving the control signal XCON1 regarding the first sub storage unit SSU1, and a first data input/output unit DIO1 for transmitting or receiving the data DTA1 regarding the first sub storage unit SSU1. The first address input unit AI1, the first control signal input unit CI1, and the first data input/output unit DIO1 may be implemented as input pins and an input/output pin, or input pads and an input/output pad.

The second input/output unit IO2 is formed independently from the first input/output unit IO1. The second input/output unit IO2 transmits or receives the data DTA2, the address Addr2, or the control signal XCON2 regarding the second sub storage unit SSU2 to or from an external device (e.g., the controller Ctr1). The second input/output unit IO2 may include a second address input unit AI2 for receiving the address Addr2 regarding the second sub storage unit SSU2, a second control signal input unit CI2 for receiving the control signal XCON2 regarding the second sub storage unit SSU2, and a second data input/output unit DIO2 for transmitting or receiving the data DTA2 regarding the second sub storage unit SSU2. The second address input unit AI2, the second control signal input unit CI2, and the second data input/output unit DIO2 may be implemented as input pins and an input/output pin, or input pads and an input/output pad.

The interface unit ICU may further include the above described first and second selection signal input units SSI1 and SSI2.

FIG. 13 shows an example when the data DTA1, the address Addr1, and the control signal XCON1 regarding the first sub storage unit SSU1, and the data DTA2, the address Addr2, and the control signal XCON2 regarding the second sub storage unit SSU2 are received via different input/output units, i.e., the first and second input/output units IO1 and IO2. Alternatively, as illustrated in FIG. 14, the first and second sub storage units SSU1 and SSU2 may share an input/output unit.

Figure 14:
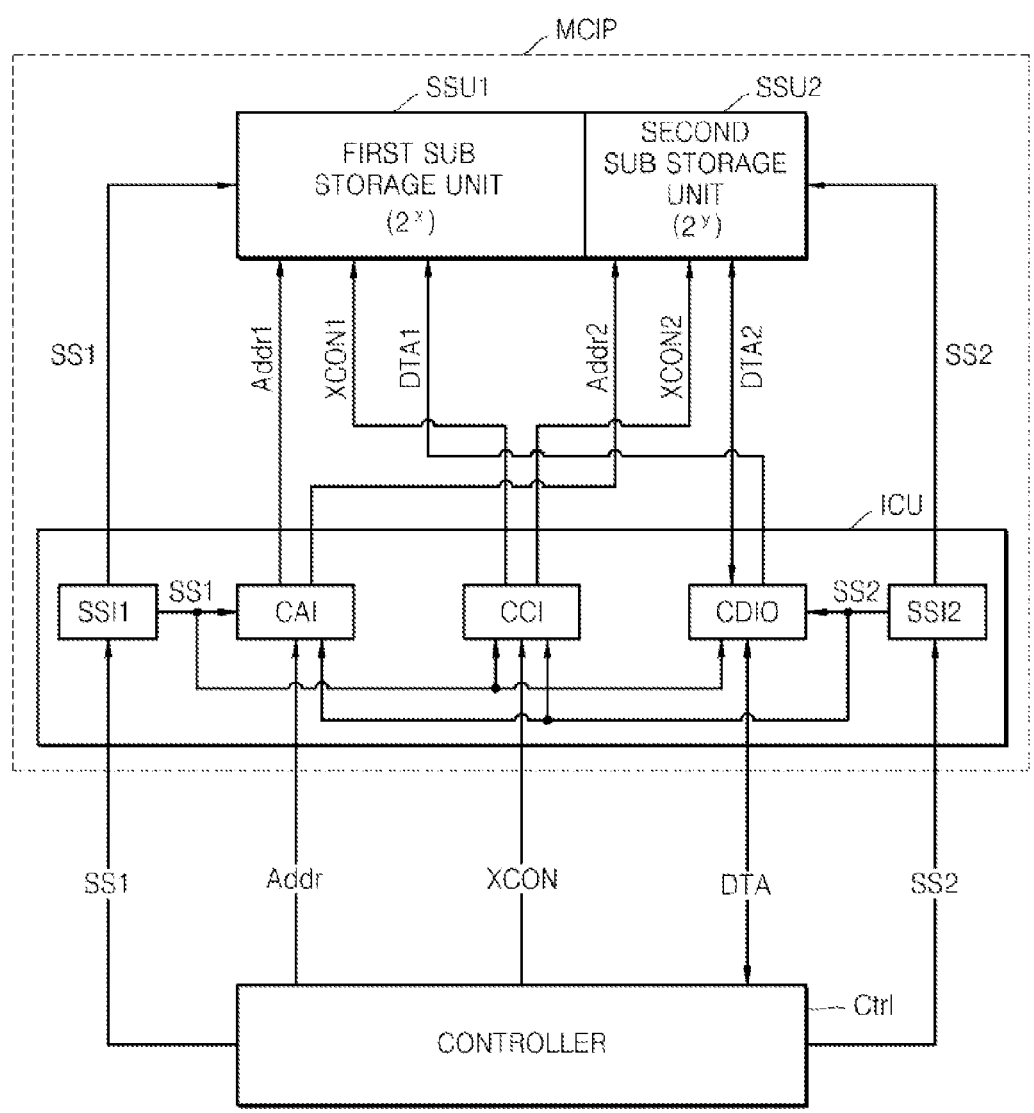

The interface unit ICU illustrated in FIG. 14 may include a common address input unit CAI, a common control signal input unit CCI, and a common data input/output unit CDIO. The common address input unit CAI receives the address Addr from the controller Ctr1, transmits the address Addr1 regarding the first sub storage unit SSU1 to the first sub storage unit SSU1, and transmits the address Addr2 regarding the second sub storage unit SSU2 to the second sub storage unit SSU2. The common control signal input unit CCI receives the control signal XCON from the controller Ctr1, transmits the control signal XCON1 regarding the first sub storage unit SSU1 to the first sub storage unit SSU1, and transmits the control signal XCON2 regarding the second sub storage unit SSU2 to the second sub storage unit SSU2. The common data input/output unit CDIO receives the data DTA from the controller Ctr1, transmits the data DTA1 regarding the first sub storage unit SSU1 to the first sub storage unit SSU1, and transmits the data DTA2 regarding the second sub storage unit SSU2 to the second sub storage unit SSU2. Also, the common data input/output unit CDIO transmits to the controller Ctr1 the data DTA1 and DTA2 respectively transmitted from the first and second sub storage units SSU1 and SSU2.

The interface unit ICU may further include the above described first and second selection signal input units SSI1 and SSI2. The common address input unit CAI, the common control signal input unit CCI, and the common data input/output unit CDIO may respectively select and output the address Addr1, the control signal XCON1, and the data DTA1 regarding the first sub storage unit SSU1 in response to the first selection signal SS1 transmitted from the first selection signal input unit SSI1. Likewise, the common address input unit CAI, the common control signal input unit CCI, and the common data input/output unit CDIO may respectively select and output the data DTA2, the address Addr2, and the control signal XCON2 regarding the second sub storage unit SSU2 in response to the second selection signal SS2 transmitted from the second selection signal input unit SSI2.

Figure 15A:
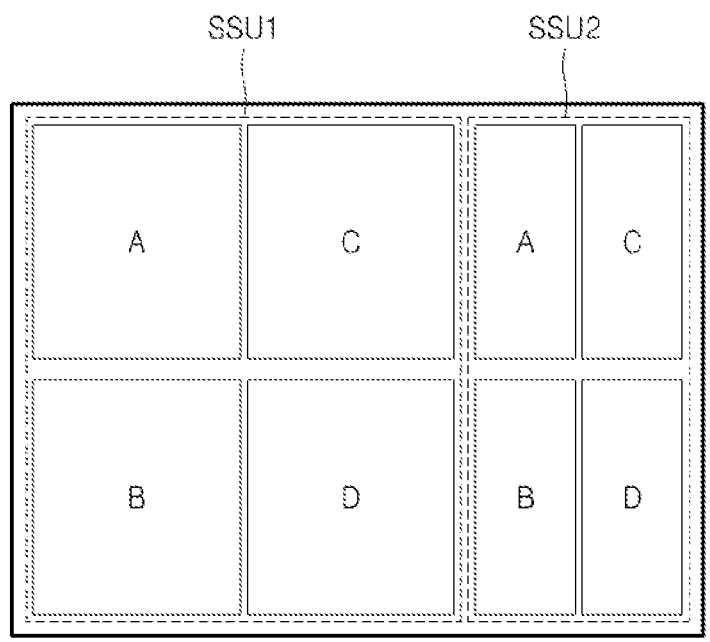
FIGS. 15A and 15B, 16A and 16B, 17A through 17F, and 18A through 18D are diagrams showing example embodiments of the first and second sub storage units illustrated in FIG. 7.
Figure 15B:
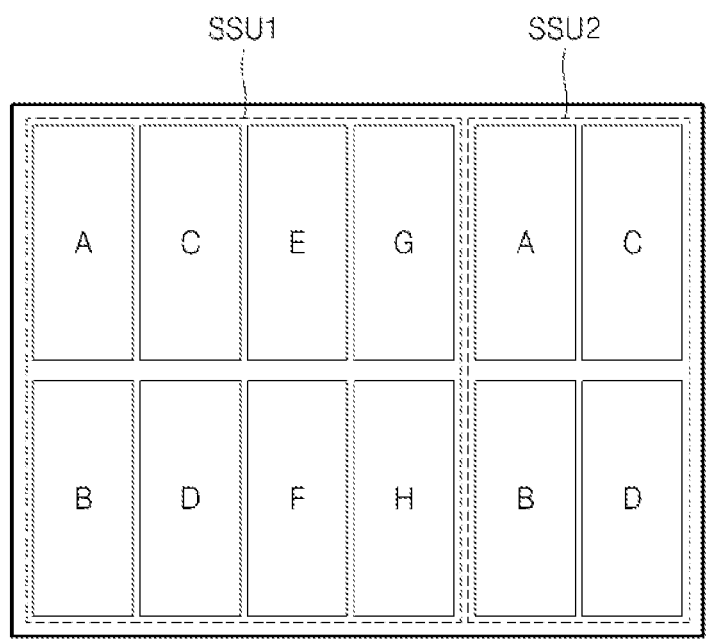

FIGS. 15A and 15B are diagrams showing example embodiments of the first and second sub storage units SSU1 and SSU2 illustrated in FIG. 7.

Referring to FIG. 15A, the first and second sub storage units SSU1 and SSU2 may include the same number of banks. FIG. 15A particularly shows an example when each of the first and second sub storage units SSU1 and SSU2 includes four banks A through D. In this case, if the third standard storage capacity ($2^x$) of the first sub storage unit SSU1 is greater than the fourth standard storage capacity ($2^y$) of the second sub storage unit SSU2, a bank size of the second sub storage unit SSU2 may be less than the bank size of the first sub storage unit SSU1.

Alternatively, as illustrated in FIG. 15B, the first and second sub storage units SSU1 and SSU2 may include different numbers of banks FIG. 15B particularly shows an example when the first sub storage unit SSU1 includes eight banks A through H, and the second sub storage unit SSU2 includes four banks A through D. In this case, if the third standard storage capacity ($2^x$) of the first sub storage unit SSU1 is greater than the fourth standard storage capacity ($2^y$) of the second sub storage unit SSU2, the first and second sub storage units SSU1 and SSU2 may have the same bank size.

Figure 16A:
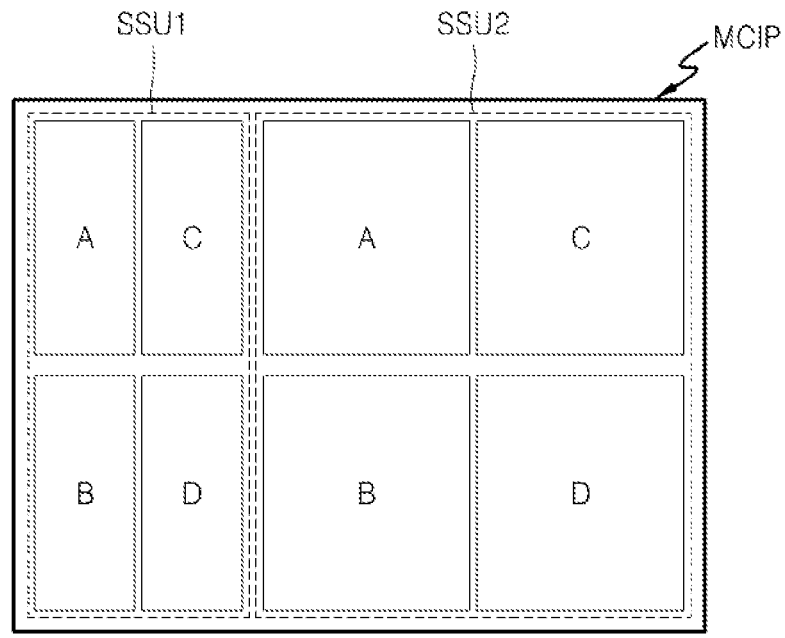
Figure 16B:
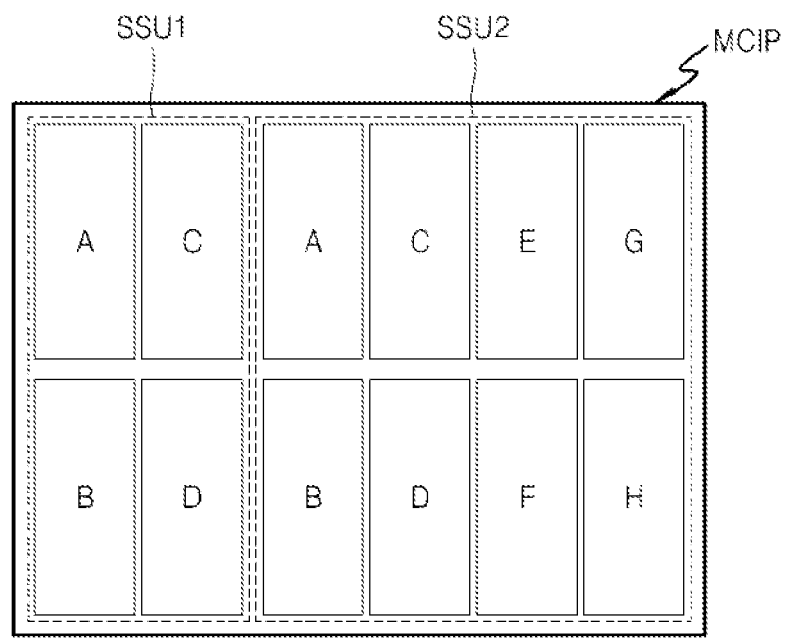

Only a case when a storage capacity of the first sub storage unit SSU1 is greater than the storage capacity of the second sub storage unit SSU2 is described above. However, the disclosure is not limited thereto. As illustrated in FIGS. 16A and 16B, the storage capacity of the first sub storage unit SSU1 may be less than the storage capacity of the second sub storage unit SSU2. If the first and second sub storage units SSU1 and SSU2 have the same number of banks as illustrated in FIG. 16A, a bank size of the second sub storage unit SSU2 may be greater than the bank size of the first sub storage unit SSU1. Otherwise, if the first and second sub storage units SSU1 and SSU2 have different numbers of banks as illustrated in FIG. 16B, the number of banks of the second sub storage unit SSU2 may be greater than the number of banks of the first sub storage unit SSU1.

Figure 17A:
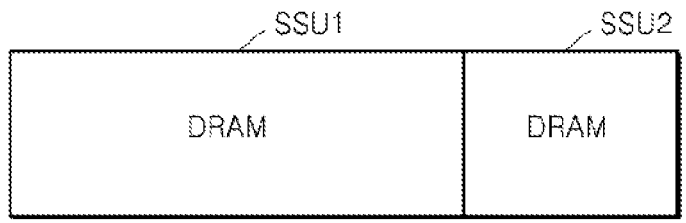
Figure 17B:
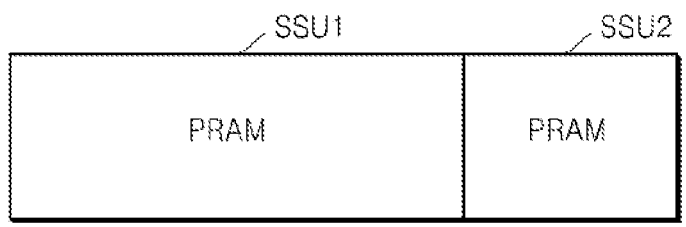
Figure 17C:
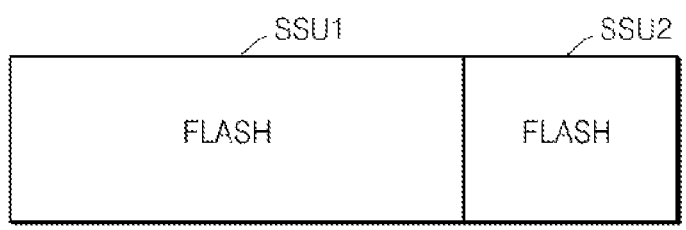

The first and second sub storage units SSU1 and SSU2 may be implemented using the same type (use) of memory cells, as illustrated in FIGS. 17A through 17C. FIG. 17A shows an example when both of the first and second sub storage units SSU1 and SSU2 are implemented as DRAM. FIG. 17B shows an example when both of the first and second sub storage units SSU1 and SSU2 are implemented as PRAM. FIG. 17C shows an example when both of the first and second sub storage units SSU1 and SSU2 are implemented as flash memory. If the first and second sub storage units SSU1 and SSU2 are implemented as flash memory, as illustrated in FIG. 17C, the first and second sub storage units SSU1 and SSU2 may be accessed in units of a page or a block.

Figure 17D:
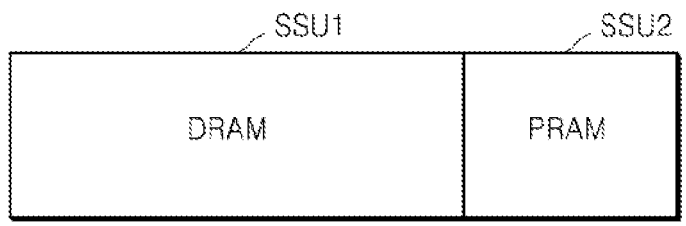
Figure 17E:
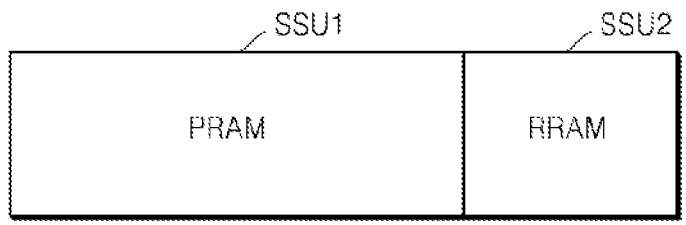
Figure 17F:
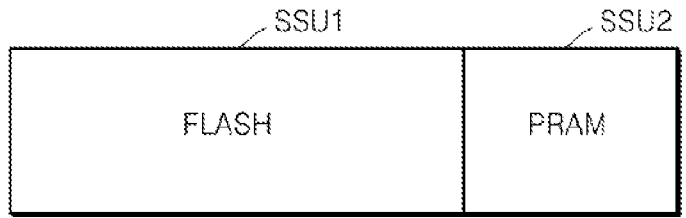

Alternatively, the first and second sub storage units SSU1 and SSU2 may be implemented using different types (uses) of memory cells, as illustrated in FIGS. 17D through 17F. FIG. 17D shows an example when the first sub storage unit SSU1 is implemented as DRAM and the second sub storage unit SSU2 is implemented as PRAM. FIG. 17E shows an example when the first sub storage unit SSU1 is implemented as PRAM and the second sub storage unit SSU2 is implemented as RRAM. FIG. 17F shows an example when the first sub storage unit SSU1 is implemented as flash memory and the second sub storage unit SSU2 is implemented as PRAM.

The first and second sub storage units SSU1 and SSU2 may also be implemented as various examples of memory in addition to the examples shown in FIGS. 17A through 17F.

Figure 18A:
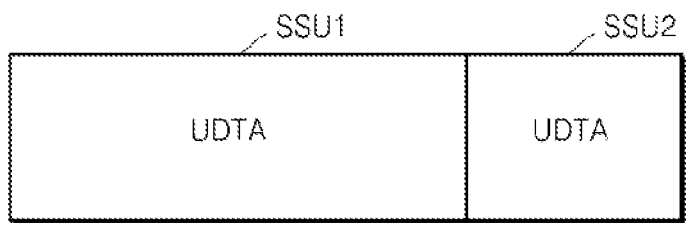
Figure 18B:
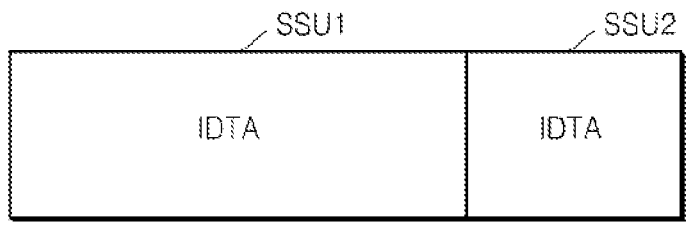

The first and second sub storage units SSU1 and SSU2 may store the same type of data, as illustrated in FIGS. 18A and 18B. FIG. 18A shows an example when both of the first and second sub storage units SSU1 and SSU2 store user data UDTA. FIG. 18B shows an example when both of the first and second sub storage units SSU1 and SSU2 store image data IDTA.

Figure 18C:
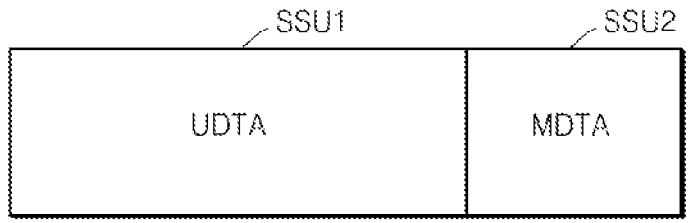
Figure 18D:
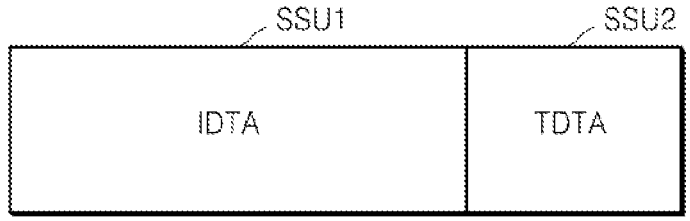

Alternatively, the first and second sub storage units SSU1 and SSU2 may store different types of data, as illustrated in FIGS. 18C and 18D. FIG. 18C shows an example when the first sub storage unit SSU1 stores user data UDTA and the second sub storage unit SSU2 stores metadata MDTA. FIG. 18D shows an example when the first sub storage unit SSU1 stores image data IDTA and the second sub storage unit SSU2 stores text data TDTA.

The first and second sub storage units SSU1 and SSU2 may also store various other types of data, in addition to the examples shown in FIGS. 18A through 18D.

Figure 19A:
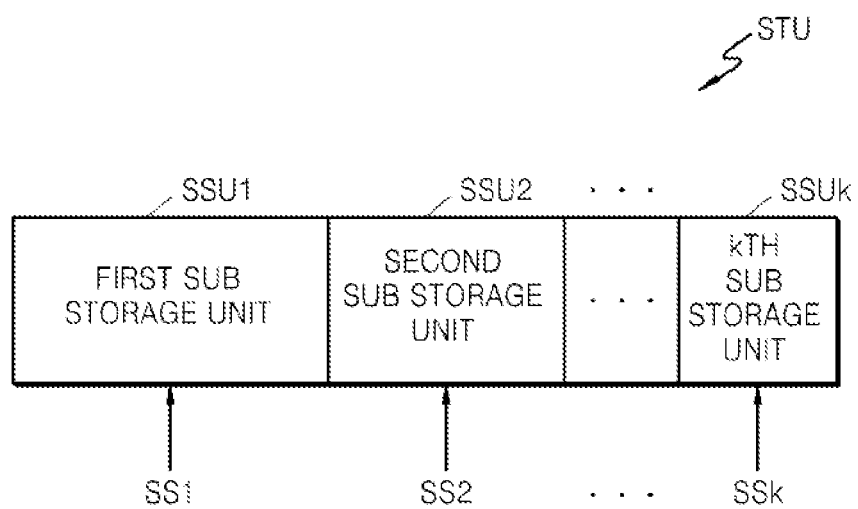
FIGS. 19A and 19B, 20, and 21 are diagrams showing example embodiments of a memory chip including three or more sub storage units, and an interface unit included in the memory chip.
Figure 19B:
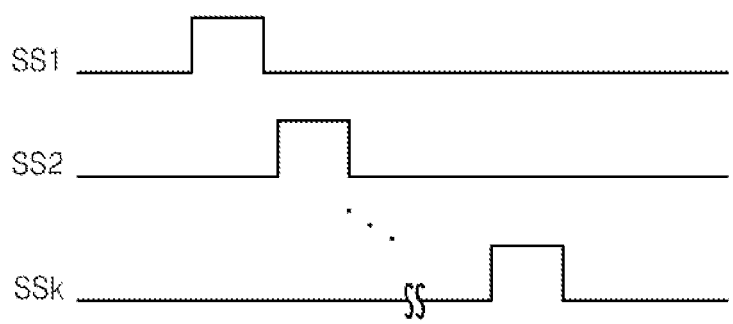

Only a case when two sub storage units are included is described above. However, the inventive concept is not limited thereto. As illustrated in FIGS. 19A and 19B, the storage unit STU may include three or more sub storage units. In FIG. 19A, the storage unit STU includes k sub storage units (k is an integer equal to or greater than 3), i.e., first through kth sub storage units SSU1 through SSUk, having standard capacities. In this case, a sum of the standard capacities of the first through kth sub storage units SSU1 through SSUk equals to an arbitrary storage capacity. For example, if the storage unit STU includes three sub storage units and the arbitrary storage capacity is 7 Gb, the three sub storage units may have standard capacities of 4 Gb, 2 Gb, and 1 Gb.

The first through kth sub storage units SSU1 through SSUk are activated in response to corresponding selection signals applied to the storage unit STU at different points of time, as illustrated in FIG. 19B. For example, the first sub storage unit SSU1 is activated in response to the first selection signal SS1, and the second sub storage unit SSU2 is activated in response to the second selection signal SS2. Likewise, the kth sub storage unit SSUk is activated in response to a kth selection signal SSk.

Figure 20:
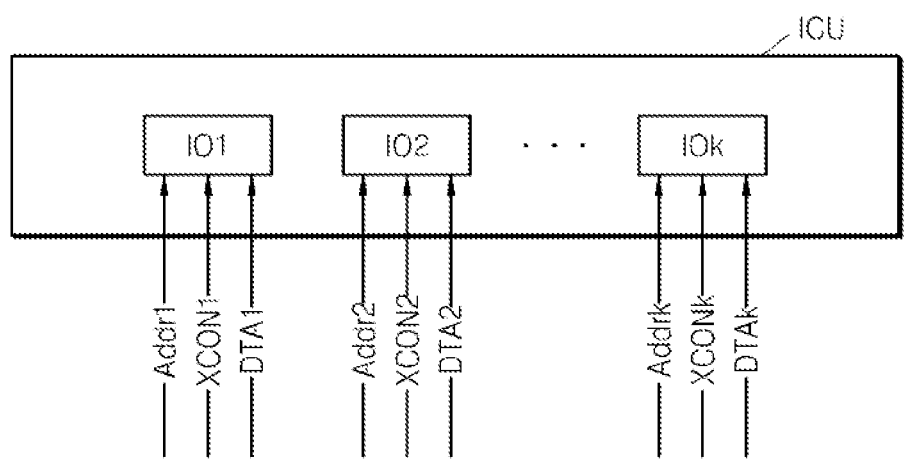

The interface unit ICU may include input/output units for transmitting or receiving data, addresses, and control signals regarding the first through kth sub storage units SSU1 through SSUk, as illustrated in FIG. 20. Referring to FIG. 20, the interface unit ICU may include a first input/output unit IO1 for transmitting or receiving the data DTA1, the address Addr1, or the control signal XCON1 regarding the first sub storage unit SSU1. a second input/output unit IO2 for transmitting or receiving the data DTA2, the address Addr2, or the control signal XCON2 regarding the second sub storage unit SSU2, through a kth input/output unit IOk for transmitting or receiving data DTAk, an address Addrk, or a control signal XCONk regarding the kth sub storage unit SSUk.

Figure 21:
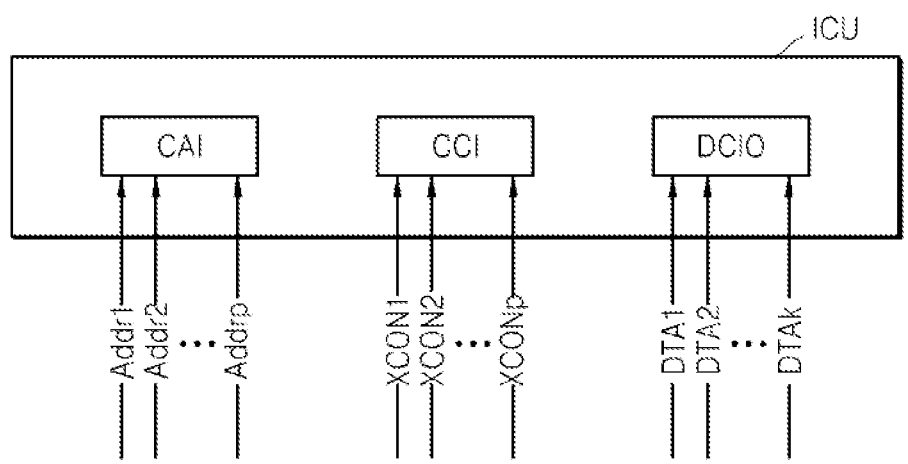

Alternatively, the interface unit ICU may include common input/output units for transmitting or receiving data, addresses, and control signals regarding the first through kth sub storage units SSU1 through SSUk, as illustrated in FIG. 21. Referring to FIG. 21, the interface unit ICU may include a common address input unit CAI for receiving the address Addr1 regarding the first sub storage unit SSU1, the address Addr2 regarding the second sub storage unit SSU2, through the address Addrk regarding the kth sub storage unit SSUk. Also, the interface unit ICU may include a common control signal input unit CCI for receiving the control signal XCON1 regarding the first sub storage unit SSU1, the control signal XCON2 regarding the second sub storage unit SSU2, through the control signal XCONk regarding the kth sub storage unit SSUk. Furthermore, the interface unit ICU may include a common data input/output unit CDIO for transmitting or receiving the data DTA1 regarding the first sub storage unit SSU1, the data DTA2 regarding the second sub storage unit SSU2, through the data DTAk regarding the kth sub storage unit SSUk.

Although the interface unit ICU includes all of the common address input unit CAI, the common control signal input unit CCI, and the common data input/output unit CDIO in FIG. 21, the interface unit ICU may include only one or two of the common address input unit CAI, the common control signal input unit CCI, and the common data input/output unit CDIO. For example, if an input/output speed of a memory chip completely depends on transmission or reception of data, an interface unit may include a common data input/output unit for transmitting or receiving data regarding all sub storage units, and independent input/output units for transmitting control signals or addresses regarding the sub storage units.

Figure 22:
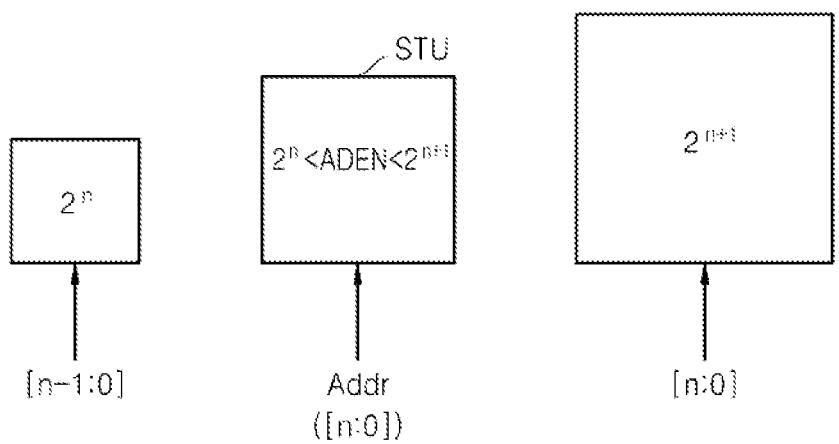
FIGS. 22 through 24 are diagrams for describing a method of accessing a memory chip, according to one embodiment.
Figure 23:
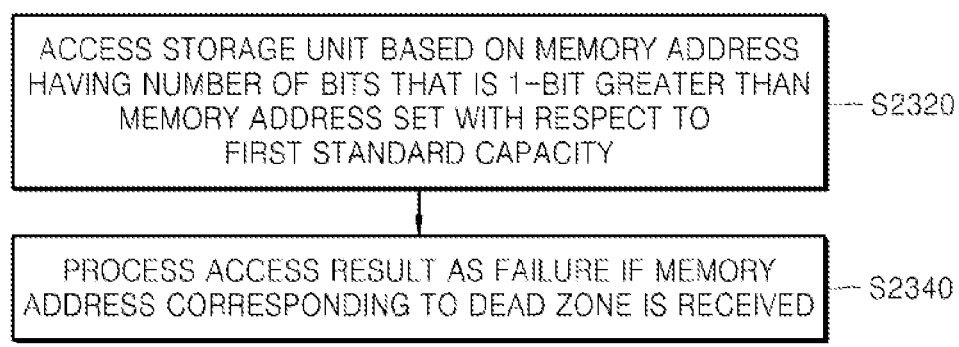

FIGS. 22 and 23 are diagrams for describing a method of accessing a memory chip, according to one embodiment.

Referring to FIGS. 22 and 23, the access method includes accessing a storage unit STU having an arbitrary storage capacity based on a memory address Addr having a number of bits (n+1) set with respect to a second standard storage capacity ($2^{n+1}$) (operation S2320), i.e., receiving a read or write command. For example, the memory chip having the arbitrary storage capacity is accessed based on the memory address Addr having a number of bits (n+1) that is 1-bit greater than the memory address Addr set with respect to a first standard storage capacity ($2^n$). As described above in relation to FIG. 1, the arbitrary storage capacity ($2^n$+m) is greater than the first standard storage capacity ($2^n$) and is less than the second standard storage capacity ($2^{n+1}$).

Figure 24:
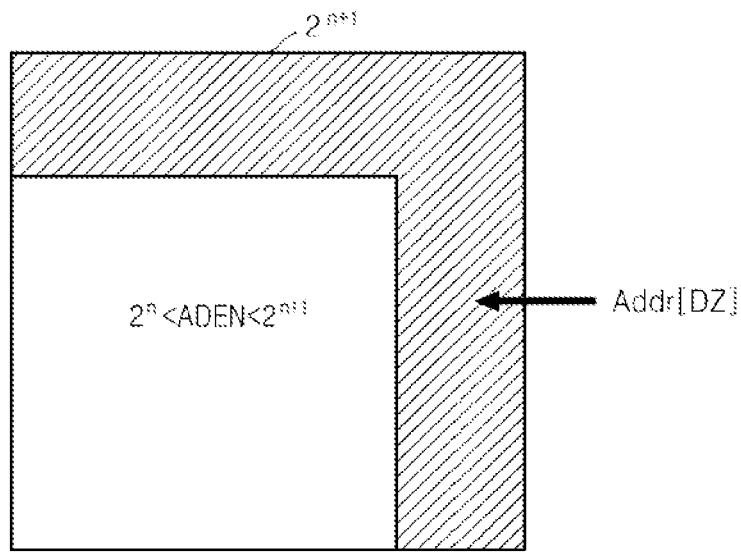

Thus, if a memory chip having an arbitrary storage capacity less than a second standard storage capacity is accessed based on a memory address having a number of bits that is the same as that of the memory address set with respect to the second standard storage capacity, as illustrated in FIG. 24, although a value (Addr[DZ]) of the memory address exists, a storage region of the memory chip (the storage unit STU illustrated in FIG. 1, etc.) corresponding to the value of the memory address, may not exist.

Here, a shaded portion illustrated in FIG. 24, where a value of a memory address exists but a storage region corresponding to the value does not exist, is referred to as a dead zone. A memory address regarding the dead zone is represented as Addr[DZ].

Figure 25A:
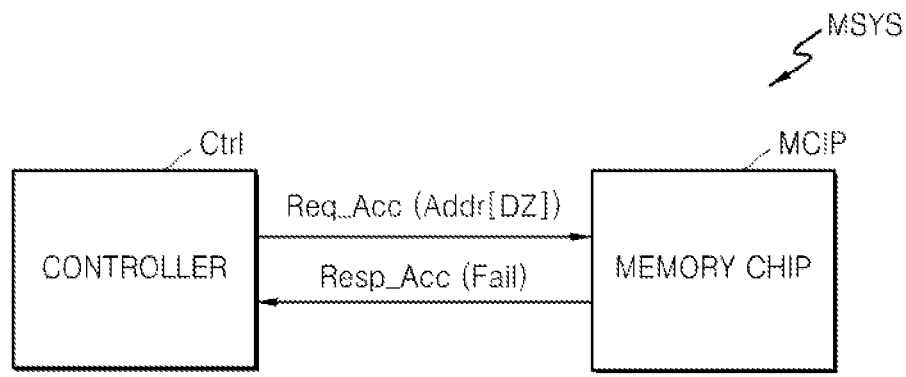
FIGS. 25A and 25B, and 26A through 26D are diagrams for describing a method of processing a dead zone, according to one embodiment.

Referring to FIGS. 1, 23, and 25A, the access method includes processing an access result as failure if a dead zone access request Req_Acc(Addr[DZ]) is received, i.e., if a read or write command regarding the dead zone is received (operation S2340). In this case, the memory chip MCIP may transmit an access failure signal Resp_Acc(fail) to the controller Ctr1.

Figure 26A:
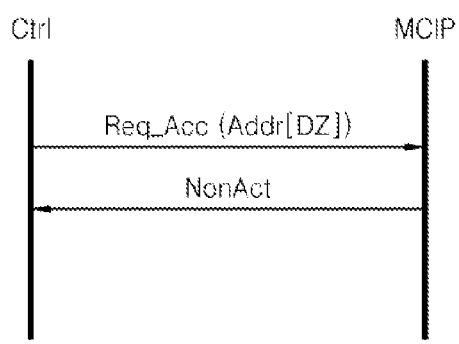

The control unit COU of the memory chip MCIP may process the dead zone access request Req_Acc(Addr[DZ]). In order to process the dead zone access request Req_Acc (Addr[DZ]), as illustrated in FIG. 26A, the control unit COU may operate in a non-active mode (NonAct). Alternatively, if the dead zone access request Req_Acc(Addr[DZ]) is received, as illustrated in FIG. 26B, the control unit COU may operate as if no command (control signal) regarding the memory address Addr[DZ] is received (NoCom).

Figure 26B:
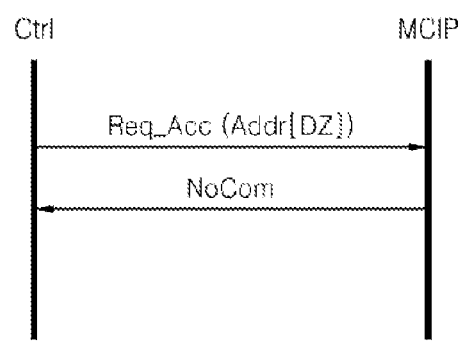

In this case, the memory chip MCIP may operate in a non-active mode (NonAct) as illustrated in FIG. 26A, or may operate as if no command (control signal) is received (NoCom), as illustrated in FIG. 26B, by performing no operation in response to the dead zone access request Req_Acc(Addr[DZ]) (e.g., by outputting no data in response to a read command). Here, if no response is received from the memory chip MCIP with respect to a command (control signal) regarding the dead zone, the controller Ctr1 may regard this as a failure.

Figure 25B:
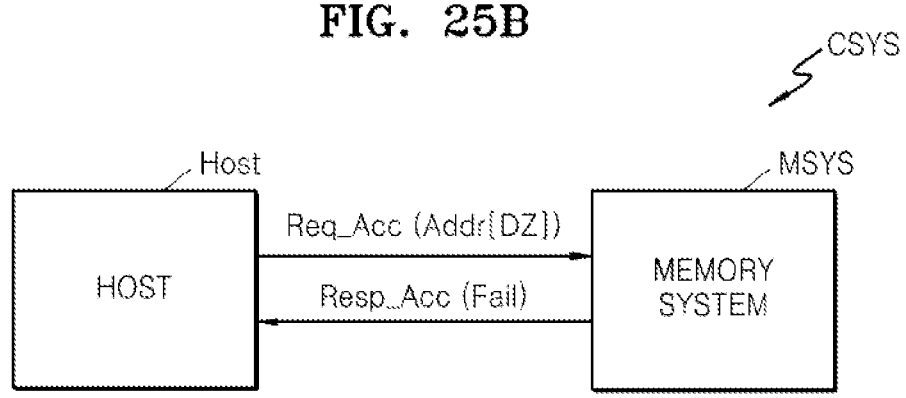
Figure 26C:
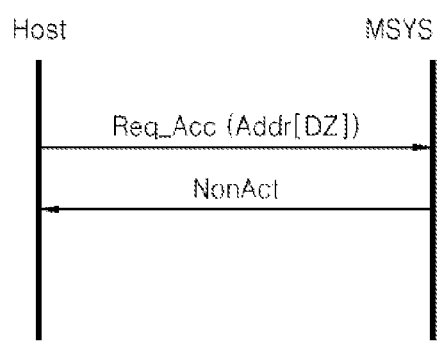
Figure 26D:
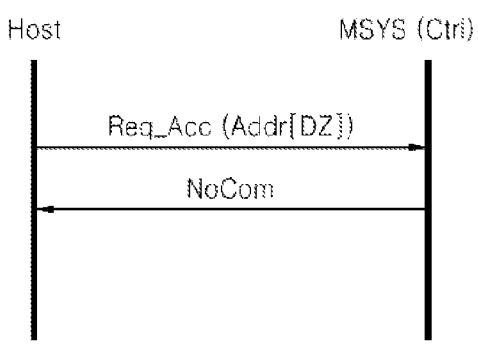

Also, the memory system MSYS may process the dead zone between a host Host and the controller Ctr1, as illustrated in FIGS. 25B, and 26C and 26D. For example, if the dead zone access request Req_Acc(Addr[DZ]) is received from the host Host, the controller Ctr1 may not transmit the dead zone access request Req_Acc(Addr[DZ]) to the memory chip MCIP and may operate the memory system MSYS in a non-active mode (NonAct), or may operate the memory system MSYS as if no command (control signal) is received (NoCom).

Figure 27:
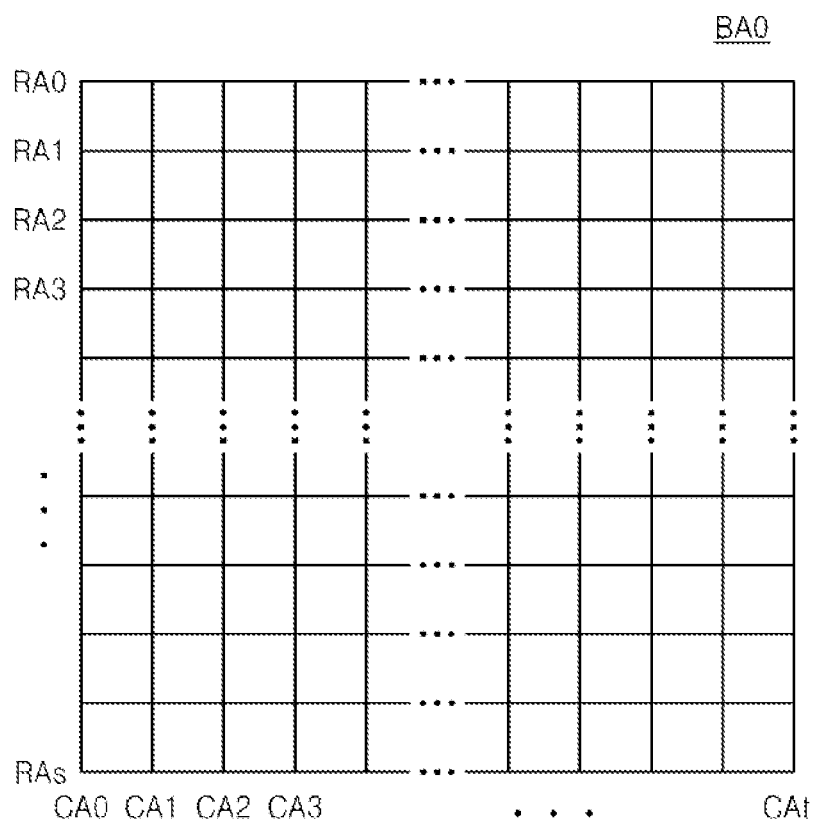
FIG. 27 is a diagram showing an exemplary configuration of banks included in a storage unit illustrated in FIG. 1.

FIG. 27 is a diagram showing an exemplary configuration of banks included in the storage unit STU illustrated in FIG. 1.

Referring to FIGS. 1 and 27, the storage unit STU may include a plurality of banks (see FIGS. 15A and 15B, and 16A and 16B). Each bank (e.g., BA0) includes a plurality of rows RA0 through RAs and a plurality of columns CA0 through CAt. Each bank BA0 includes a plurality of memory cells (not shown) connected to the rows RA0 through RAs and the columns CA0 through CAt. In order to store or read data in or from an arbitrary memory cell, the control unit COU applies a voltage to a row and a column corresponding to a memory (or single) address Addr.

Figure 28:
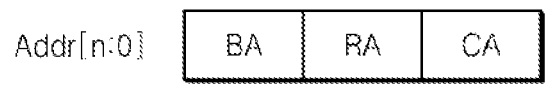
FIG. 28 is a table showing an exemplary configuration of an address.

Accordingly, as illustrated in FIG. 28, the memory address Addr may include a bank address BA, a row address RA, and a column address CA. However, in the memory address Addr, positions of the row address RA and the column address CA may differ from those illustrated in FIG. 28. The number of the memory address bits of Addr may depend on the number of I/O organization and may be chose as part of the memory chip design. Hereinafter, the number of I/O organization is referred as x1.

Figures 29, 30, 31:
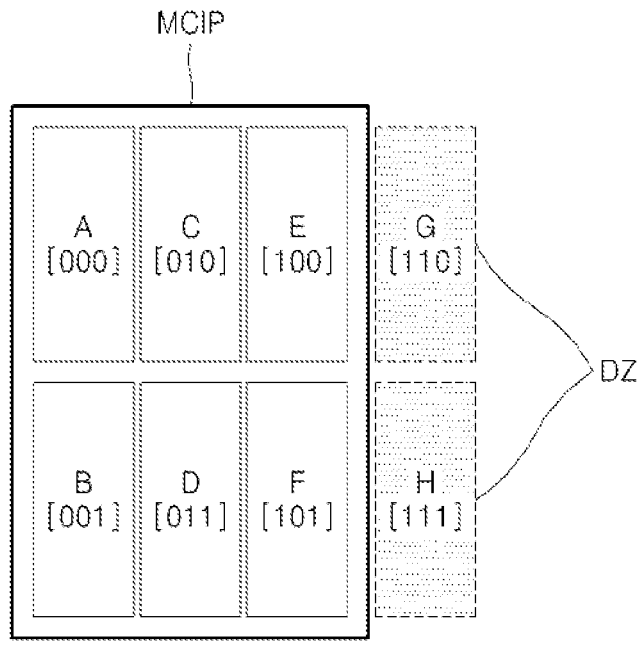
FIG. 29 is a table showing an example of an address in a memory chip having a first standard capacity.
FIG. 30 is a table showing an example of an address in a memory chip, according to an embodiment.
FIG. 31 is a diagram showing a dead zone caused by the address illustrated in FIG. 30.

As illustrated in FIG. 29, an n-bit address of a memory chip having the first standard storage capacity $2^n$ may be formed of an (a+1)-bit bank address BA, a (b+1)-bit row address RA, and a (c+1)-bit column address CA. A sum of the numbers of bits of the bank address BA, the row address RA, and the column address CA, i.e., (a+1)+(b+1)+(c+1), equals to the number of bits of the address of the memory chip, i.e., n.

As described above in relation to FIG. 1, the memory chip MCIP having the arbitrary storage capacity ADEN may be set as a memory address Addr[n:0] having n+1 bits that is 1-bit greater than n bits of the memory address Addr set with respect to the memory chip having the first standard storage capacity $2^n$. For example, as illustrated in FIG. 30, the bank address BA of the memory address Addr has a+2 bits (n+1) that is 1-bit greater than a+1 bits of the bank address BA of the memory chip having the first standard storage capacity $2^n$.

If each bank size of the memory chip having the first standard storage capacity $2^n$ is the same as the bank size of the memory chip MCIP having the arbitrary storage capacity, and the arbitrary storage capacity is greater than the first standard storage capacity $2^n$ by 1.5 times, the memory chip having the first standard storage capacity $2^n$ may include banks A through D illustrated in FIG. 31 while the memory chip MCIP having the arbitrary storage capacity may include banks A through F illustrated in FIG. 31.

Since the bank address BA according to an embodiment of the inventive concept is set to be 1-bit greater than the bank address BA regarding the first standard storage capacity $2^n$, as illustrated in FIG. 30, banks corresponding to parts of the bank address BA according to an embodiment of the inventive concept may not exist on the memory chip MCIP. For example, if the bank address BA regarding the first standard storage capacity $2^n$ is 2 bits and the bank address BA according to an embodiment of the inventive concept is 3 bits, banks G and H corresponding to bank addresses [110] and [111] illustrated in FIG. 31 do not exist on the memory chip MCIP and thus may be processed as the dead zone DZ.

If the bank address BA regarding the dead zone DZ is received, as described above in relation to FIGS. 23, and 25A and 25B, the control unit COU may process an access result as failure. As described above in relation to FIG. 5, the control unit COU may be located outside storage regions (banks), or between banks A, C, and E, and banks B, D, and F.

If a memory chip according to an embodiment is a flash memory chip, a bank address may be a block address.

Figures 32, 33:
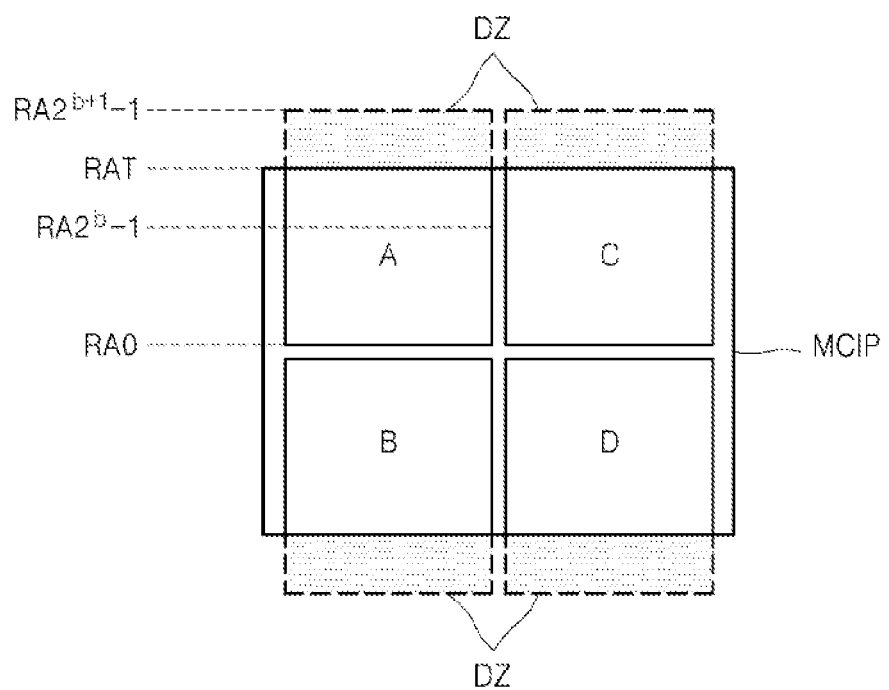
FIG. 32 is a table showing an example of an address in a memory chip, according to another embodiment.
FIGS. 33 and 34 are diagrams showing examples of a dead zone caused by the address illustrated in FIG. 32.

As illustrated in FIG. 32, the row address RA of the (n+1)-bit memory address Addr according to an embodiment may be 1-bit greater than the row address RA regarding the memory chip having the first standard storage capacity $2^n$. If each bank size of the memory chip having the first standard storage capacity $2^n$ equals to the bank size of the memory chip MCIP having the arbitrary storage capacity, the memory chip having the first standard storage capacity $2^n$ may include rows corresponding to row addresses RA0 through $RA2^b-1$ illustrated in FIG. 33 while the memory chip MCIP having the arbitrary storage capacity may include rows corresponding to row addresses RA0 through RAT illustrated in FIG. 33. The row address RAT has a value between row addresses $RA2^b$ and $RA2^{b+1}-1$.

Since the row address RA according to an embodiment of the inventive concept is set to be 1-bit greater than the row address RA regarding the first standard storage capacity $2^n$ as illustrated in FIG. 32, rows corresponding to parts of the row address RA according to an embodiment of the inventive concept may not exist. If the row address RA regarding the first standard storage capacity $2^n$ is (b+1) bits and the row address RA according to an embodiment of the inventive concept is (b+2) bits, as illustrated in FIG. 32, rows corresponding to row addresses RAT+1 through $RA2^{b+1}-1$ illustrated in FIG. 33 do not exist on the memory chip MCIP and thus may be processed as the dead zone DZ.

If the row address RA regarding the dead zone DZ is received, as described above in relation to FIGS. 23, and 25A and 25B, the control unit COU may process an access result as failure.

Figures 34, 35:
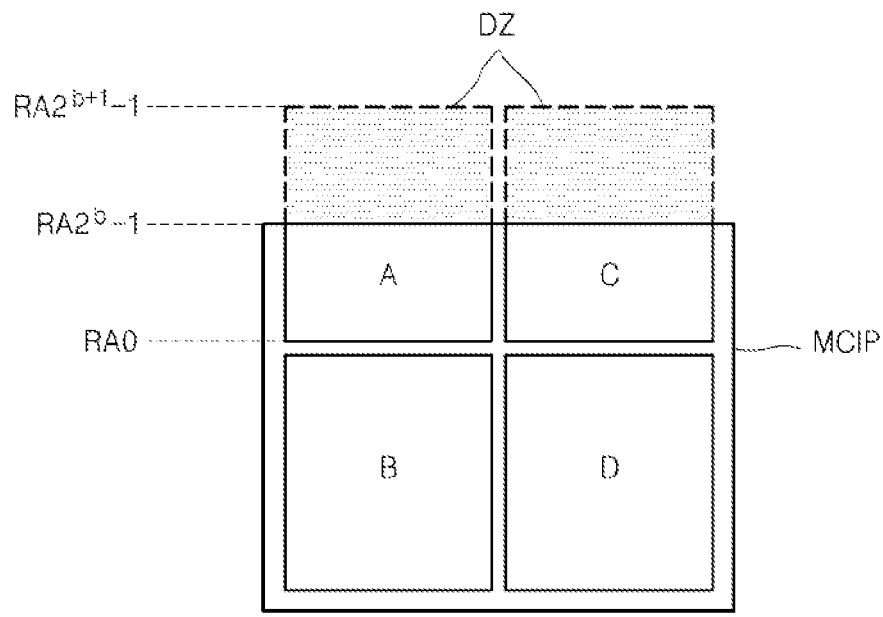
FIG. 35 is a table showing an example of an address in a memory chip, according to another embodiment.

FIG. 33 illustrates an example when row addresses RAT+1 through $RA2^{b+1}-1$ for forming the dead zone DZ are equally included in all banks A through D. However, the inventive concept is not limited thereto. Referring to FIG. 34, the dead zone DZ of the memory chip MCIP may be formed in rows of only some banks In FIG. 34, the dead zone DZ may not be formed in the banks B and D, and only rows corresponding to row addresses $RA2^b$ through $RA2^{b+1}-1$ of the banks A and bank C may be processed as the dead zone DZ. The dead zone DZ is not limited to the example illustrated in FIG. 34, and may be formed variously on the memory chip MCIP having the row address RA illustrated in FIG. 32.

As illustrated in FIG. 35, the column address CA of the (n+1)-bit memory address Addr according to an embodiment of the inventive concept may be 1-bit greater than the column address CA regarding the memory chip having the first standard storage capacity $2^n$. If a bank size of the memory chip having the first standard storage capacity $2^n$ equals to the bank size of the memory chip MCIP having the arbitrary storage capacity, the memory chip having the first standard storage capacity $2^n$ may include columns corresponding to column addresses CA0 through $CA2^c-1$ illustrated in FIG. 36 while the memory chip MCIP having the arbitrary storage capacity may include columns corresponding to column addresses CA0 through CAT illustrated in FIG. 36. The column address CAT has a value between column addresses $CA2^c$ and $RA2^{c+1}-1$.

Since the column address CA according to an embodiment of the inventive concept is set to be 1-bit greater than the column address CA regarding the first standard storage capacity $2^n$, as illustrated in FIG. 35, columns corresponding to parts of the column address CA according to an embodiment of the inventive concept may not exist. If the column address CA regarding the first standard storage capacity $2^n$ is (c+1) bits and the column address CA according to an embodiment of the inventive concept is (c+2) bits, as illustrated in FIG. 36, columns corresponding to column addresses CAT+1 through $CA2^{c+1}-1$ illustrated in FIG. 36 do not exist on the memory chip MCIP and thus may be processed as the dead zone DZ.

If the column address CA regarding the dead zone DZ is received, as described above in relation to FIGS. 23, and 25A and 25B, the control unit COU may process an access result as failure.

Figure 36:
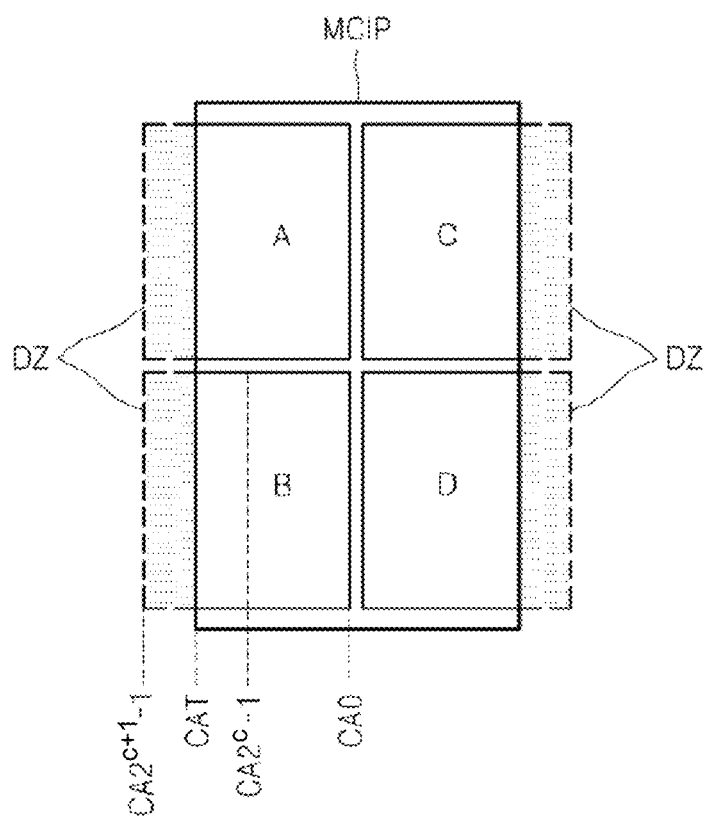
FIGS. 36 and 37 are diagrams showing examples of a dead zone caused by the address illustrated in FIG. 35.
Figure 37:
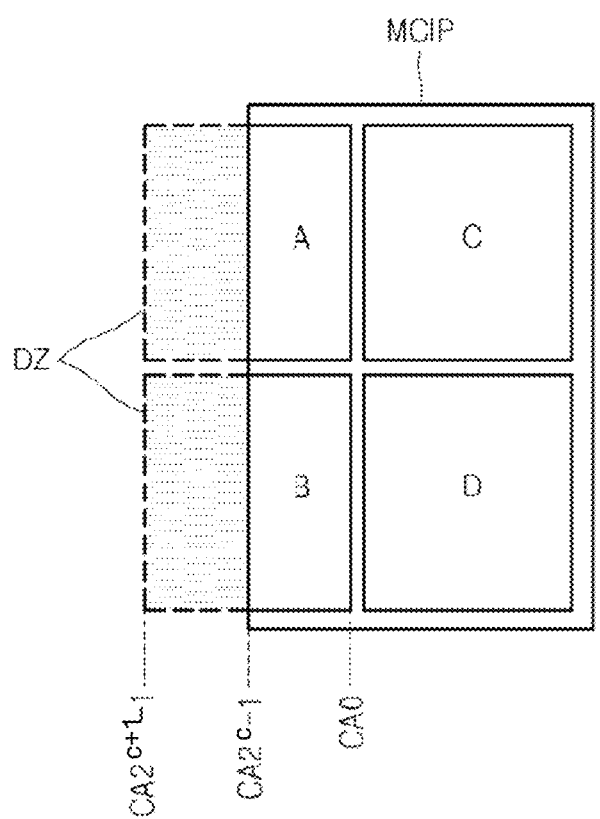

FIG. 36 illustrates an example when column addresses CAT+1 through $CA2^{c+1}-1$ for forming the dead zone DZ are equally included in all banks A through D. However, the inventive concept is not limited thereto. Referring to FIG. 37, the dead zone DZ of the memory chip MCIP may be formed in columns of only some banks. In FIG. 37, the dead zone DZ may not be formed in the banks C and D, and only columns corresponding to column addresses $CA2^c$ through $CA2^{c+1}-1$ of the banks A and bank B may be processed as the dead zone DZ. The dead zone DZ is not limited to the example illustrated in FIG. 37, and may be formed variously on the memory chip MCIP having the column address CA illustrated in FIG. 35.

Figure 38:
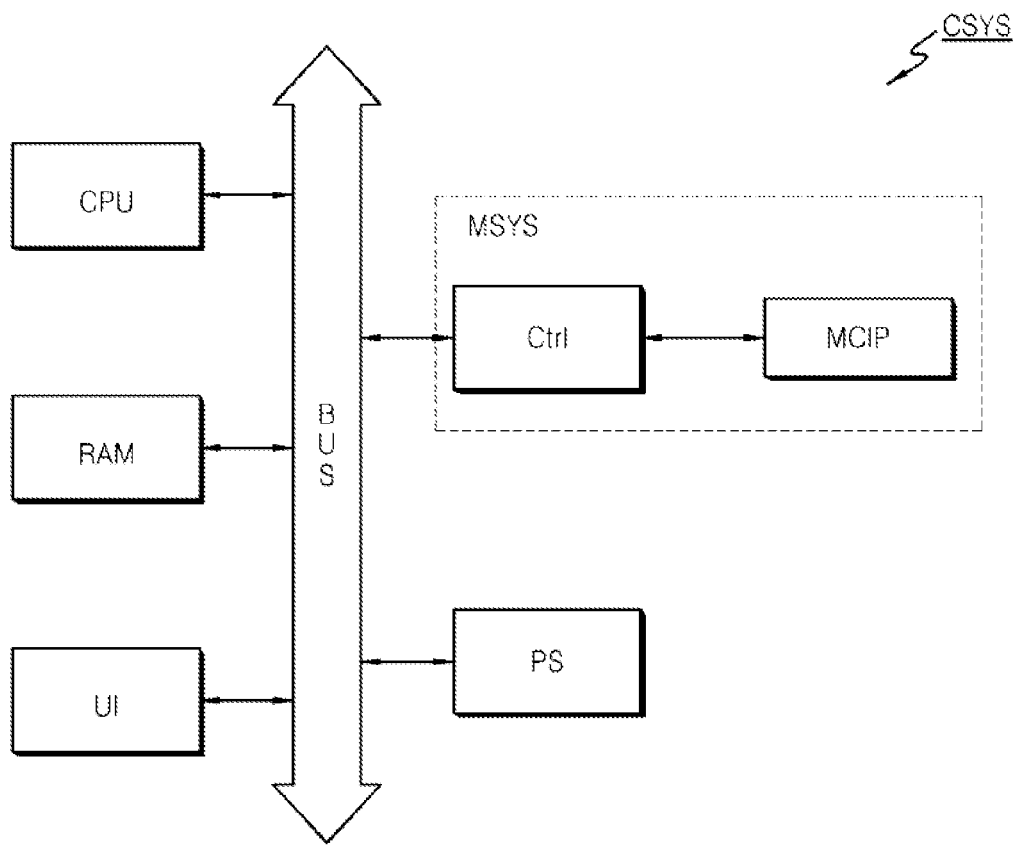
FIG. 38 is a block diagram of a computer system according to an embodiment.

FIG. 38 is a block diagram of a computer system CSYS according to an embodiment of the inventive concept.

Referring to FIG. 38, the computer system CSYS includes a processor CPU, a user interface UI, and a memory system MSYS, which are electrically connected to a bus BUS. The memory system MSYS includes a controller Ctrl and a memory chip MCIP. The memory chip MCIP may store N-bit data (N is an integer equal to or greater than 1) processed or to be processed by the processor CPU by the control of the controller Ctrl. The memory chip MCIP included in the memory system MSYS illustrated in FIG. 38 may be the memory system MSYS illustrated in FIG. 1, etc., and may be accessed by using the access method illustrated in FIG. 2 or 23. Accordingly, since the memory chip MCIP has various storage capacities, the computer system CSYS may rapidly satisfy demands for high storage capacity and may reduce a package thickness and power consumption in comparison to a case when a memory chip has the same storage capacity.

The computer system CSYS may further include a power supplier PS. If the computer system CSYS is a mobile device, a battery for providing an operation voltage of the computer system CSYS and a modem such as a baseband chipset may be additionally provided. Also, the computer system CSYS may further include well-known elements such as an application chipset, a camera image processor (CIS), mobile DRAM, etc., and detailed descriptions thereof are not provided here.

Figure 39:
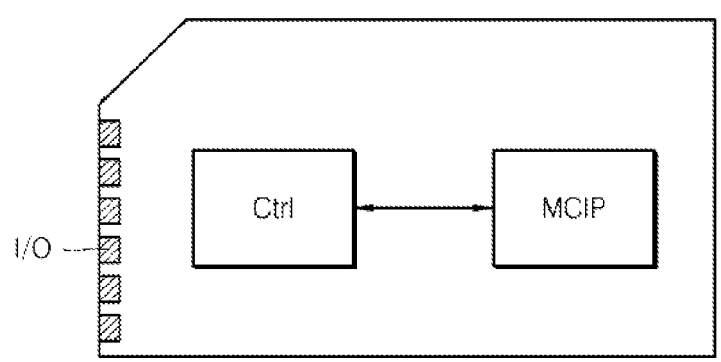
FIG. 39 is a schematic diagram of a memory card according to an embodiment.

FIG. 39 is a schematic diagram of a memory card MCRD according to an embodiment of the inventive concept.

Referring to FIG. 39, the memory card MCRD includes a controller Ctrl and a memory chip MCIP. The controller Ctrl controls a write or read operation of data into or from the memory chip MCIP in response to a request of an external host (not shown), which is received via an input/output means I/O. In order to control the operation, the controller Ctrl of the memory card MCRD may include interfaces (not shown) for interfacing with a host and the memory chip MCIP, and random access memory (RAM) (not shown). The memory card MCRD may be implemented as the memory system MSYS illustrated in FIG. 6, etc.

The memory card MCRD may be a compact flash card (CFC), a microdrive, a smart media card (SMC), a multimedia card (MMC), a security digital card (SDC), a memory stick, a universal serial bus (USB) flash memory drive, etc. Accordingly, since the memory chip MCIP has various storage capacities, the memory card MCRD may rapidly satisfy demands for high storage capacity and may reduce a package thickness and power consumption in comparison to a case when a memory chip has the same storage capacity.

Figure 40:
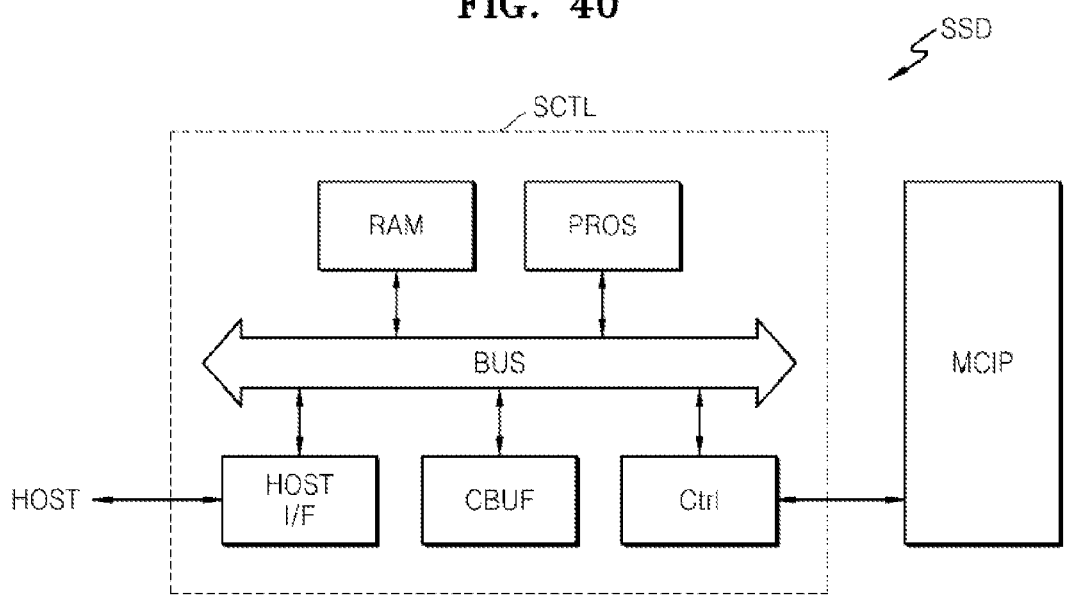
FIG. 40 is a block diagram of a solid state drive (SSD) according to an embodiment.

FIG. 40 is a block diagram of a solid state drive (SSD) according to an embodiment of the inventive concept.

Referring to FIG. 40, the SSD includes an SSD controller SCTL and a memory chip MCIP. The SSD controller SCTL includes a processor PROS, RAM, a cache buffer CBUF, and a controller Ctrl, which are connected via a bus BUS. The processor PROS controls the controller Ctrl to transmit and receive data to and from the memory chip MCIP in response to a request (a command, an address, or data) of a host (not shown). The processor PROS and the controller Ctrl of the SSD may be implemented as one RAM processor. Data required to operate the processor PROS may be loaded to the RAM.

A host interface HOST I/F transmits the request received from the host to the processor PROS, or transmits data received from the memory chip MCIP to the host. The host interface HOST I/F may interface with the host by using one of various interface protocols such as USB, man machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE). The data transmitted from or to be transmitted to the memory chip MCIP may be temporarily stored in the cache buffer CBUF. The cache buffer CBUF may be, for example, a static RAM (SRAM).

The SSD may be implemented as the memory system MSYS including the memory chip MCIP, illustrated in FIG. 6, etc. Accordingly, since the memory chip MCIP has various storage capacities, the SSD may rapidly satisfy demands for high storage capacity and may reduce a package thickness and power consumption in comparison to a case when a memory chip has the same storage capacity.

Figure 41:
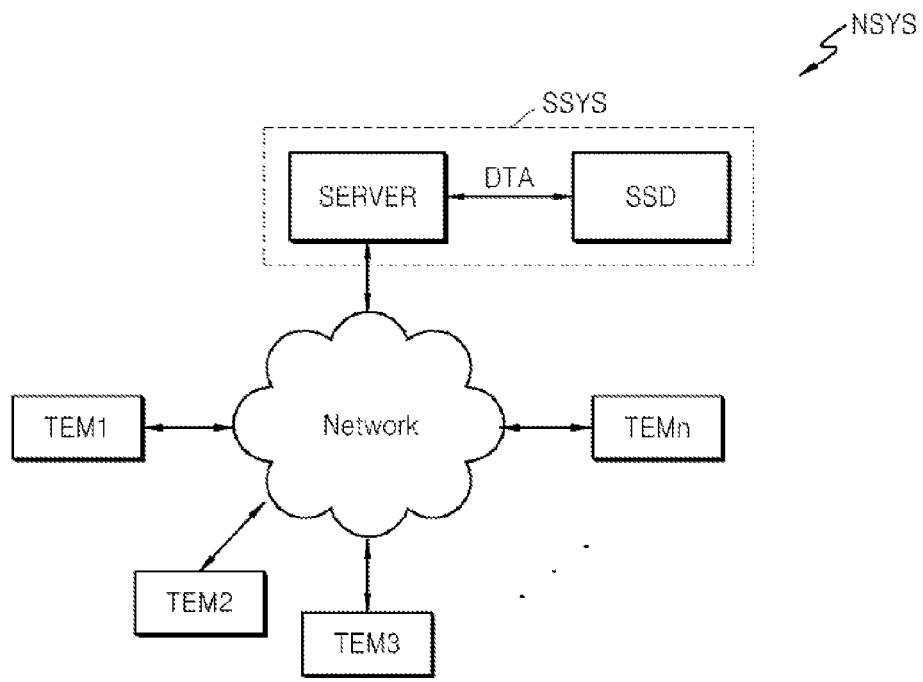
FIG. 41 is a schematic diagram of a server system including an SSD, and a network system including the server system, according to an embodiment.

FIG. 41 is a schematic diagram of a server system SSYS including an SSD, and a network system NSYS including the server system SSYS, according to an embodiment of the inventive concept.

Referring to FIG. 41, the network system NSYS may include the server system SSYS and first through nth terminals TEM1 through TEMn, which are connected via a network. The server system SSYS may include a server SERVER for processing requests received from the first through nth terminals TEM1 through TEMn, and the SSD for storing data corresponding to the requests received from the first through nth terminals TEM1 through TEMn. In this case, the SSD illustrated in FIG. 41 may be the SSD illustrated in FIG. 40. That is, the SSD illustrated in FIG. 41 may include the SSD controller SCTL and the memory chip MCIP, and the memory chip MCIP may be the memory chip MCIP illustrated in FIG. 6, etc.

The disclosure has been particularly shown and described with reference to exemplary embodiments thereof. Terms used herein to describe the disclosure are for descriptive purposes only and are not intended to limit the scope of the disclosure.

Figure 42A:
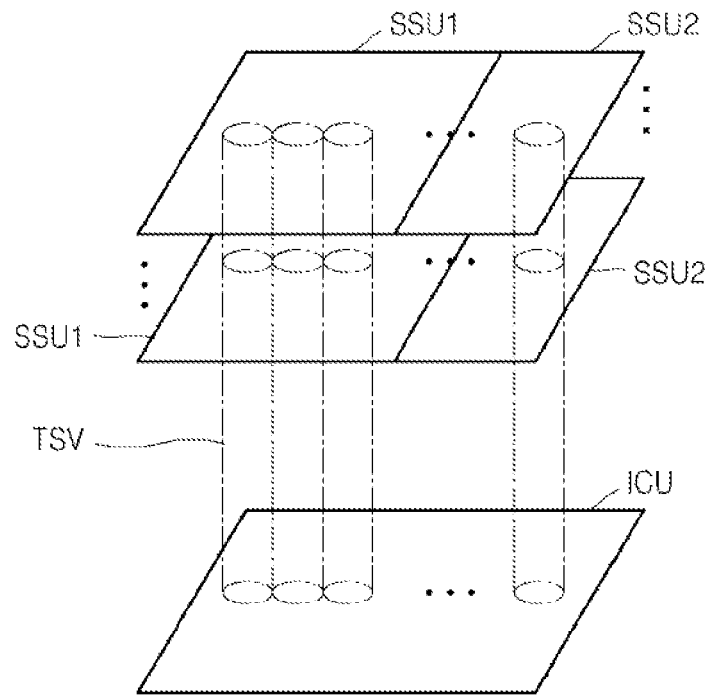
FIGS. 42A and 42B are schematic diagrams of a memory system including through-silicon vias (TSVs), according to an embodiment.
Figure 42B:
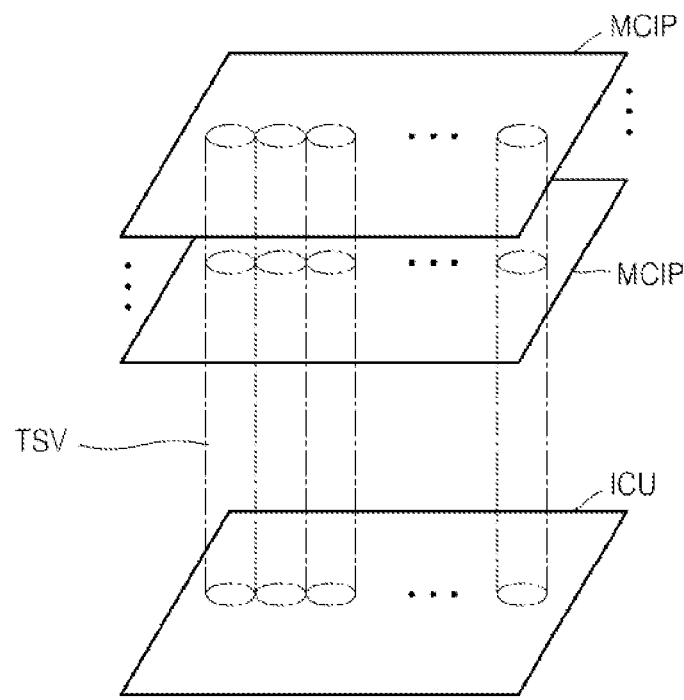

For example, although the memory system MSYS illustrated in FIG. 6, etc. is described as a two-dimensional system, the disclosure is not limited thereto. As illustrated in FIGS. 42A and 42B, the memory system MSYS may be a three-dimensional system for transmitting or receiving signals by using through-silicon vias (TSVs) between layers, e.g., between an interface chip ICU and a memory chip MCIP, or between memory chips MICPs as illustrated in FIG. 42B.

Accordingly, it will be understood by one of ordinary skill in the art that various changes in form and details may be made therein without departing from the spirit and scope of the following claims.

What is claimed is:

1. A single memory chip comprising:
   a plurality of banks, each of the banks comprising a plurality of memory cells organized into rows and columns, wherein the memory cells of all the banks are a same type of memory cell,
   the memory cells of the single memory chip being organized as a plurality of externally accessible memory cell units, the total storage capacity of the single memory chip being greater than $2^n$ and less than $2^{n+1}$ externally accessible memory cell units, each memory cell unit formed by one or more of the memory cells of the single memory chip, each memory cell unit being identifiable by a corresponding address unique to the memory cell unit and each memory cell unit comprising a minimum addressable size of memory of the single memory chip so as to not include portions that are separately addressable; and
   a control unit of the single memory chip configured to receive a single address from an external source that is external to the single memory chip, the single address consisting of n+1 bits and comprising a bank address of a+1 bits to identify one of the banks of the single memory chip, a row address of b+2 bits to identify a row of memory of the identified bank, and a column address of c+1 bits to identify a portion of memory of the identified row of memory of the identified bank, where (a+1)+(b+2)+(c+1)=n+1,
   wherein the control unit is configured to control write operations of data received from the external source to a memory cell unit identified by the single address and to control read operations to provide data read from the memory cell unit identified by the single address to the external source,
   wherein n, a, b and c are integers, and
   wherein at least some of the banks comprise less than $2^{b+2}$ rows of memory.

2. The single memory chip of claim 1, wherein a total addressable space of the single memory chip is less than $2^{n+1}$.

3. The single memory chip of claim 1, wherein the row of memory identified by the row address is not mapped to the single memory chip.

4. The single memory chip of claim 3, wherein, if the row of memory identified by the row address that is not mapped to the single memory chip is received, the control unit processes an access result regarding the single address as a failure.

5. The single memory chip of claim 4, wherein the control unit operates to process the access result regarding the single address as the failure by maintaining the single memory chip being non-activated, or by operating as if a command regarding the single address is not received.

6. The single memory chip of claim 1, wherein one bit of the b+2 bits of the row address is a bank address.

7. The single memory chip of claim 1, wherein one bit of the b+2 bits of the row address is a row selection address for accessing one of the rows of the single memory chip.

8. The single memory chip of claim 1, wherein the single memory chip includes at least one of the group consisting of dynamic random access memory (DRAM), static random access memory (SRAM), flash memory, resistive random access memory (RRAM), magnetoresistive random access memory (MRAM), and phase-change random access memory (PRAM).

9. A single memory chip comprising:
   a plurality of banks, each of the banks comprising a plurality of memory cells organized into rows and columns, wherein the memory cells of all the banks are a same type of memory cell,
   the memory cells of the single memory chip being organized as a plurality of externally accessible memory cell units, the total number of the externally accessible memory cell units of the single memory chip being greater than $2^n$ and less than $2^{n+1}$, each memory cell unit formed by one or more of the memory cells of the single memory chip, each memory cell unit being identifiable by a corresponding address unique to the memory cell unit and each memory cell unit comprising a minimum addressable size of memory of the single memory chip so as to not include portions that are separately addressable; and
   a control unit of the single memory chip configured to receive a single address from an external source that is external to the single memory chip, the single address consisting of n+1 bits and comprising a bank address of a+1 bits to identify one of the banks of the single memory chip, a row address of b+1 bits to identify a row of memory of the identified bank, and a column address of c+2 bits to identify a portion of memory of the identified row of memory of the identified bank, where (a+1)+(b+1)+(c+2) =n+1,
   wherein the control unit is configured to control write operations of data received from the external source to a memory cell unit identified by the single address and to control read operations to provide data read from the memory cell unit identified by the single address to the external source,
   wherein n, a, b and c are integers, and
   wherein at least some of the banks comprise less than $2^{c+2}$ columns of the identified row of memory.

10. The single memory chip of claim 9, wherein a total addressable space of the single memory chip is less than $2^{n+1}$.

11. The single memory chip of claim 9, wherein the portion of the memory identified by the column address is not mapped to the single memory chip.

12. The single memory chip of claim 11, wherein, if the portion of the memory identified by the column address that is not mapped to the single memory chip is received, the control unit processes an access result regarding the single address as a failure.

13. The single memory chip of claim 12, wherein the control unit operates to process the access result regarding the single address as the failure by operating as if a column command regarding the single address is not received.

14. The single memory chip of claim 9, wherein one bit of the c+2 bits of the column address is a column selection address for accessing one of the columns of the single memory chip.

15. The single memory chip of claim 9, wherein the single memory chip includes at least one of the group consisting of dynamic random access memory (DRAM), static random access memory (SRAM), flash memory, resistive random access memory (RRAM), magnetoresistive random access memory (MRAM), and phase-change random access memory (PRAM).

16. A method of operating a single memory chip having a plurality of banks, each of the banks comprising a plurality of memory cells organized into rows and columns, the memory cells of the single memory chip being organized as a plurality of externally accessible memory cell units, the total number of the externally accessible memory cell units of the single memory chip being greater than $2^n$ and less than $2^{n+1}$, each memory cell unit being identifiable by a corresponding address unique to the memory cell unit and each memory cell unit comprising a minimum addressable size of memory of the single memory chip so as to not include portions that are separately addressable, comprising:

receiving a single address from an external source that is external to the single memory chip, the single address consisting of n+1 bits and comprising a bank address of a+1 bits to identify one of the banks of the single memory chip, a row address of b+2 bits to identify a row of memory of the identified bank, and a column address of c+1 bits to identify a portion of memory of the identified row of memory of the identified bank, where (a+1)+(b+2)+(c+1) =n+1;

activating the identified row of the identified bank in response to the row address for controlling write and read operations of data into and from the single memory chip if the row address is mapped to the single memory chip, and not activating any row of the single memory chip if the row address is not mapped to the single memory chip; and selecting the portion of the memory of the identified row of the identified bank in response to the column address for write and read operations of data into and from the single memory chip if the row is activated and not selecting any portion of the memory of the identified row of the identified bank if the row address is not activated, wherein n, a, b and c are integers, and wherein at least some of the banks comprise less than $2^{b+2}$ rows of memory.

17. The method of claim 16, wherein a total addressable space of the single memory chip is less than $2^{n+1}$.

18. The method of claim 16, wherein one bit of the b+2 bits of the row address is a bank address.

19. The method of claim 16, one bit of the b+2 bits of the row address is a row selection address for accessing one of the rows of the single memory chip.

20. The method of claim 16, wherein the single memory chip includes at least one of the group consisting of dynamic random access memory (DRAM), static random access memory (SRAM), flash memory, resistive random access memory (RRAM), magnetoresistive random access memory (MRAM), and phase-change random access memory (PRAM).

* * * * *